(12) United States Patent
Yamazaki

(10) Patent No.: US 7,734,940 B2
(45) Date of Patent: Jun. 8, 2010

(54) DATA COMMUNICATION DEVICE HAS DATA SIGNAL GENERATION CIRCUIT AND TRANSMISSION CIRCUIT ON BASIS OF REFERENCE VOLTAGE AND RECEIVED SIGNAL

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 673 days.

(21) Appl. No.: 11/687,233

(22) Filed: Mar. 16, 2007

(65) Prior Publication Data

US 2007/0288780 A1 Dec. 13, 2007

(30) Foreign Application Priority Data

Apr. 18, 2006 (JP) ............... 2006-114884

(51) Int. Cl.
*G06F 1/26* (2006.01)
*H04B 1/38* (2006.01)

(52) U.S. Cl. .................. 713/322; 713/300; 375/220; 375/256

(58) Field of Classification Search ............ 713/322, 713/300; 375/220, 256
See application file for complete search history.

(56) References Cited

U.S. PATENT DOCUMENTS

| 5,473,635 | A | * | 12/1995 | Chevroulet | 375/287 |
| 5,600,634 | A | | 2/1997 | Satoh | |
| 5,828,703 | A | * | 10/1998 | Kanda | 375/316 |
| 6,222,403 | B1 | | 4/2001 | Mitsuda | |
| 7,113,547 | B2 | | 9/2006 | Inoue | |
| 7,146,450 | B2 | | 12/2006 | Saitou et al. | |
| 7,664,168 | B2 | * | 2/2010 | Yamazaki | 375/220 |

| 2003/0123590 | A1 | 7/2003 | Saitou |
| 2005/0008080 | A1 | 1/2005 | Nakashima |
| 2006/0098691 | A1 | 5/2006 | Yamazaki |

FOREIGN PATENT DOCUMENTS

| EP | 0 963 044 | 8/1999 |
| EP | 1 168 272 | 2/2002 |
| JP | 11-43435 | 6/1989 |
| JP | 2-274139 | 11/1990 |
| JP | 6-69911 | 3/1994 |
| JP | 7-231316 | 8/1995 |
| JP | 7-264250 | 10/1995 |
| JP | 11-346147 | 12/1999 |
| JP | 2003-69653 | 3/2003 |
| JP | 2003-199178 | 7/2003 |
| JP | 2004-363684 | 12/2004 |
| JP | 2006-135888 | 5/2006 |

* cited by examiner

*Primary Examiner*—Chun Cao
(74) *Attorney, Agent, or Firm*—Fitzpatrick, Cella, Harper & Scinto

(57) ABSTRACT

A data communication device performs stable data communications without a malfunction in a system downsized by realizing bi-directional data communications using two terminals. The data communication device includes: a signal terminal (IN) for inputting a received signal having portions of different duty ratios and a constant pulse frequency; a reference voltage terminal (GND) for inputting a first reference voltage; a clock generation circuit for generating a clock signal according to the received signal; a data signal generation circuit for generating a data signal by identifying a duty ratio of the received signal; a transmission circuit for outputting a transmission signal to the signal terminal; and a regulator circuit for generating power supply voltages of the clock generation circuit, the data signal generation circuit, and the transmission circuit on a basis of an internally generated second reference voltage, the received signal, and the first reference voltage.

14 Claims, 15 Drawing Sheets

DATA COMMUNICATION DEVICE HAS DATA SIGNAL GENERATION CIRCUIT AND TRANSMISSION CIRCUIT ON BASIS OF REFERENCE VOLTAGE AND RECEIVED SIGNAL

BACKGROUND OF THE INVENTION

1. Field of the Invention

The present invention relates to a data communication device, a data communication system, and a data communication method for communications in the field of FA (factory automation) and the like.

2. Description of the Related Art

FIG. 21 illustrates the rough configuration of the conventional data communication system. In the configuration shown in FIG. 21, when a data carrier device 802 and a control device 801 perform data communications, four connection points are provided for each of a power supply VIN, a ground GND, a clock signal CLK, and a data signal DATA.

In a system in which a control device and a data carrier device perform data communications, there is a configuration for downsizing the system with two connection points used for bi-directional data communications.

For example, Japanese Patent Application Laid-Open No. 2003-069653 as a Japanese Patent describes the configuration.

FIG. 22 only illustrates a data carrier device 900 in the configuration including the control device and a data carrier device capable of performing bi-directional data communication using two connection points described in Japanese Patent Application Laid-Open No. 2003-069653. Using the timing chart for the data carrier device 900 in FIG. 22 shown in FIG. 23, the operation of the data carrier device 900 shown in FIG. 22 is described below.

The data carrier device 900 has only two terminals, that is, a terminal A and a terminal B, and the two terminals perform data communications with the control device. The terminal A receives a pulse voltage VA having a constant duty ratio.

The pulse voltage VA has two high level (hereinafter referred to as an H level) values of a voltage amplitude, that is, V1 and V2, and a low level (hereinafter referred to as an L level) is ground (GND) potential. The other terminal B receives a pulse voltage VB having equal voltage amplitude and an opposite phase as compared with the pulse voltage VA input to the terminal A. In the data carrier device 900 in which the pulse voltages VA and VB are input, a clock generation circuit 901 generates a clock signal CLK synchronized to the frequency of the two pulse voltages VA and VB. A VA+VB circuit 902 rectifies the two pulse voltages VA and VB, and generates a constant voltage indicating the H level having two values of V1 and V2 and the L level of the GND potential of the voltage amplitude as shown in FIG. 23. An amplitude identification circuit 903 detects the differential voltage of the voltage amplitude of the H level, and generates a data signal DATA. The clock signal CLK and the data signal DATA are supplied to an internal circuit 904 of the data carrier device 900, and the data to be communicated is generated.

As a data communication unit from the data carrier device 900, the impedance is converted between the terminals A and B by, for example, establishing a short circuit in the terminals A and B, and detecting it by a control device. Thus, the data from the data carrier device 900 is received.

Another configuration for establishing bi-directional data communications using two connection points with a view to downsizing a system is described in, for example, Japanese Patent Application Laid-Open No. H06-069911.

FIG. 24 illustrates the configuration for realizing the bi-directional data communication using two connection points described in Japanese Patent Application Laid-Open No. H06-069911. With the configuration shown in FIG. 24, when data is transmitted from a master 1 to a slave 2 in a data transmission circuit for performing bi-directional data communication between the master 1 and the slave 2, the data to be transmitted is superposed on the direct current voltage and transmitted according to a voltage signal. On the other hand, when the data is transmitted from the slave 2 to the master 1, it is transmitted as a current signal by drawing a current through a constant current circuit from the potential difference existing between the circuits, thereby realizing full-duplex communications in a two-wire.

With the configuration shown in FIG. 24, each bit of the transmission data from the master 1 to the slave 2 has a rising edge and a falling edge, and the rise timing of each bit is different from each other's and associated with the logic "1" or "0". Thus, the data is superposed on the clock signal and supplied to the slave 2, and the data from the slave 2 to the master 1 can be transmitted in synchronization with the clock signal. Furthermore, a clock signal line for transmission of a clock signal is added, and can be communicated in a clock synchronous system.

In addition, Japanese Patent Application Laid-Open No. H11-346147 describes a configuration in which a sudden entry into an ON or OFF state of an output transistor can be avoided, and an output waveform can be slowly changed in a circuit for ON/OFF control of a constant current circuit.

FIG. 25 illustrates the configuration in which an output waveform can be slowly changed in a circuit for ON/OFF control of a constant current circuit described in Japanese Patent Application Laid-Open No. H11-346147. The configuration shown in FIG. 25 refers to an open/drain through rate output circuit for controlling using two constant currents IrH and IrL the gate electrode of the Q0 of the N-channel output transistor in which a drain electrode is grounded and in which an load RL is connected between the Vdd power supply line and the source electrode.

If an input pulse signal Vin changes from the low level to the high level, it is inverted by the inverters I1 and I2, and the gates of a P channel transistor Q1 and an N channel transistor Q2 enter the low level. Therefore, the P channel transistor Q1 is placed in the ON state, the N channel transistor Q2 is placed in the OFF state, the input capacity of the output transistor Q0 is charged by the constant current IrH from a constant current source CS1, and it gradually becomes the high level, thereby placing the output transistor Q0 in the ON state. When the input pulse signal Vin changes from the high level to the low level, the P channel transistor Q1 enters the OFF state, and the N channel transistor Q2 enters the ON state. Then, the input capacity of the output transistor Q0 is discharged by the constant current IrL from a constant current source CS2, and it gradually enters the low level, thereby placing the output transistor Q0 in the OFF state. Therefore, by controlling the values of the constant currents IrH and IrL, the charge/discharge time of the output transistor Q0 to the input capacity can be changed, and the rise time or the fall time of potential Vgate of the gate electrode of the output transistor Q0 for the input pulse signal Vin can be controlled. Thus, the fall time or the rise time of the output voltage Vout can be controlled.

In the Japanese Patent Application Laid-Open No. 2004-363684 as a Japanese patent, the control device transmits an in-phase clock pulse as a first transmission signal, and an opposite-phase clock pulse as a second transmission signal. At this time, when the "H" pulse of the second transmission signal is modulated to advance by the time of td1 over the "L"

pulse of the first transmission signal when the transmission data has the logic "1", and advance by the time of td2 when the transmission data has the logic "0". The data carrier device demodulates data by detecting the change in delay time of the second transmission signal using the clock extracted from the first transmission signal.

However, the above-mentioned conventional data carrier device has the following problems. First, the four connection points respectively provided for the devices for the power supply VIN, the ground GND, the clock signal CLK, and the data signal DATA as shown in FIG. 21 are not appropriate in downsizing the system because four connection points are required to perform data communications.

The data carrier device 900 shown in FIG. 22 can operate without problems when no phase difference is detected between the pulse voltage VA input to the terminal A and the pulse voltage VB input to the terminal B. However, when there is phase difference, there occurs a period in which both of the two pulse voltages VA and VB are placed in the L level or the H level. Therefore, there arises a period in which electric power is not supplied to the data carrier device 900. As a result, there is the problem that the data carrier device 900 cannot be stably operated. In the actual configuration of the system, there often occurs a delay in an internal circuit between the timing of outputting a pulse voltage VA and the timing of outputting a pulse voltage VB in the control device. Also, there often occurs a difference in impedance caused by a resistance value, a parasitic capacity, etc. in the wiring from the control device to the terminal A and to the terminal B of the data carrier device 900. Therefore, it is very difficult to completely suppress the phase difference between the pulse voltage VA input to the terminal A and the pulse voltage VB input to the terminal B.

With the configuration shown in FIG. 24, the data to be transmitted is superposed on the direct current voltage. Therefore, when the circuit of the slave 2 operates with the data-superposed voltage as a power supply voltage, the power supply voltage largely fluctuates, thereby causing the operation of the internal circuit of the slave 2 to be unstable. Therefore, it is difficult to perform stable data communication. When the circuit of the slave 2 does not use the data-superposed voltage as a power supply voltage, stable data communication can be performed, but another input terminal for supplying a power supply voltage for the operation of the circuit is required. As a result, the system becomes large and costly.

With the configuration shown in FIG. 25, the charge/discharge time of the output transistor to the input capacity is changed, and the rise time or the fall time of the potential of the gate electrode of the output transistor for the input pulse signal is controlled. However, the moment when the potential of the gate electrode of the output transistor becomes higher or lower than the threshold voltage for the output transistor to be placed in the ON state, the output transistor suddenly changes from the OFF state to the ON state, or from the ON state to the OFF state. Therefore, the fall time or the rise time of the output voltage indicates a sharp change, and the configuration is not satisfactory for a moderate change of an output waveform.

SUMMARY OF THE INVENTION

The objective of the present invention is to provide a data communication device, a data communication system, and a data communication method having the following characteristics.

That is, the objective is to downsize a system by enabling bi-directional data communications to be realized using two terminals, and to realize stable data communications that hardly fall into a malfunction with a simple circuit configuration requesting no strict precision.

The data communication device according to the present invention includes: a signal terminal for inputting a received signal having portions of different duty ratios and a constant pulse frequency; a reference voltage terminal for inputting a first reference voltage; a clock generation circuit for generating a clock signal according to the received signal; a data signal generation circuit for generating a data signal by identifying a duty ratio of the received signal; a transmission circuit for outputting a transmission signal to the signal terminal; and a regulator circuit for generating power supply voltages of the clock generation circuit, the data signal generation circuit, and the transmission circuit on a basis of an internally generated second reference voltage, the received signal, and the first reference voltage. The data communication device further includes: a reference voltage circuit for generating the second reference voltage; and a level shift circuit for level-shifting a pulse of the received signal on a basis of a threshold correlated with the second reference voltage. The regulator circuit generates a power supply voltage correlated with the second reference voltage, and there is a correlation between the threshold and the power supply voltage.

The data communication device according to the present invention includes: a signal terminal for inputting a received signal; a reference voltage terminal for inputting a first reference voltage; a clock generation circuit for generating a clock signal according to the received signal; a data signal generation circuit for generating a data signal on a basis of the received signal; a transmission circuit for receiving the clock signal and the data signal and outputting a transmission signal to the signal terminal; and a regulator circuit for generating power supply voltages of the clock generation circuit, the data signal generation circuit, and the transmission circuit on a basis of an internally generated second reference voltage, the received signal, and the first reference voltage. The data communication device further includes: a reference voltage circuit for generating the second reference voltage; and a level shift circuit for level-shifting a pulse of the received signal on a basis of a threshold correlated with the second reference voltage. The regulator circuit generates a power supply voltage correlated with the second reference voltage, and there is a correlation between the threshold and the power supply voltage.

The data communication system according to the present invention is a data communication system in which a first data communication device and a second data communication device are connected through at least a signal terminal. The first data communication device includes: a voltage amplitude modulation circuit for outputting a signal having portions of different duty ratios and a constant pulse frequency to the second data communication device through the signal terminal on a basis of data; and a current detection circuit for generating a data signal on a basis of a current running through the signal terminal. The second data communication device includes: a signal terminal for inputting from the first data communication device the signal having portions of different duty ratios and a constant pulse frequency as a received signal; a reference voltage terminal for inputting a first reference voltage; a clock generation circuit for generating a clock signal according to the received signal; a data signal generation circuit for generating a data signal by identifying a duty ratio of the received signal; a transmission circuit for outputting a signal to the signal terminal; and a regulator circuit for generating power supply voltages of the clock generation circuit, the data signal generation circuit, and the transmission circuit on a basis of an internally generated second reference voltage, the received signal, and the first reference voltage. The data communication device further includes: a reference voltage circuit for generating the second reference voltage; and a level shift circuit for level-shifting a pulse of the received signal on a basis of a threshold correlated with the second reference voltage. The regulator circuit generates a power supply voltage correlated with the second reference voltage, and there is a correlation between the threshold and the power supply voltage.

A data communication method according to the present invention includes: inputting to a signal terminal a received signal having portions of different duty ratios and a constant pulse frequency; inputting a first reference voltage to a reference voltage terminal; generating a clock signal according to the received signal; generating a data signal by identifying a duty ratio of the received signal; outputting a transmission signal to the signal terminal; and generating power supply voltages on a basis of an internally generated second reference voltage, the received signal, and the first reference voltage. The data communication method further includes: generating the second reference voltage; and level-shifting a pulse of the received signal on a basis of a threshold correlated with the second reference voltage. The step of generating power supply voltages generates a power supply voltage correlated with the second reference voltage, and there is a correlation between the threshold and the power supply voltage.

Using the following units, two terminals enable bi-directional data communications, thereby downsizing the system. In addition, with a simple circuit configuration without strict precision, a stable data communication that hardly causes a malfunction can be realized. Further, the stable operation of another circuit having the output voltage VREG of the regulator circuit as a power supply voltage can be performed. Therefore, data communications can be stably performed without a malfunction.

Further features of the present invention will become apparent from the following description of exemplary embodiments with reference to the attached drawings.

DESCRIPTION OF THE EMBODIMENTS

Exemplary embodiment of the present invention are described below in detail by referring to the attached drawings.

First Embodiment of the Present Invention

Figure 1:
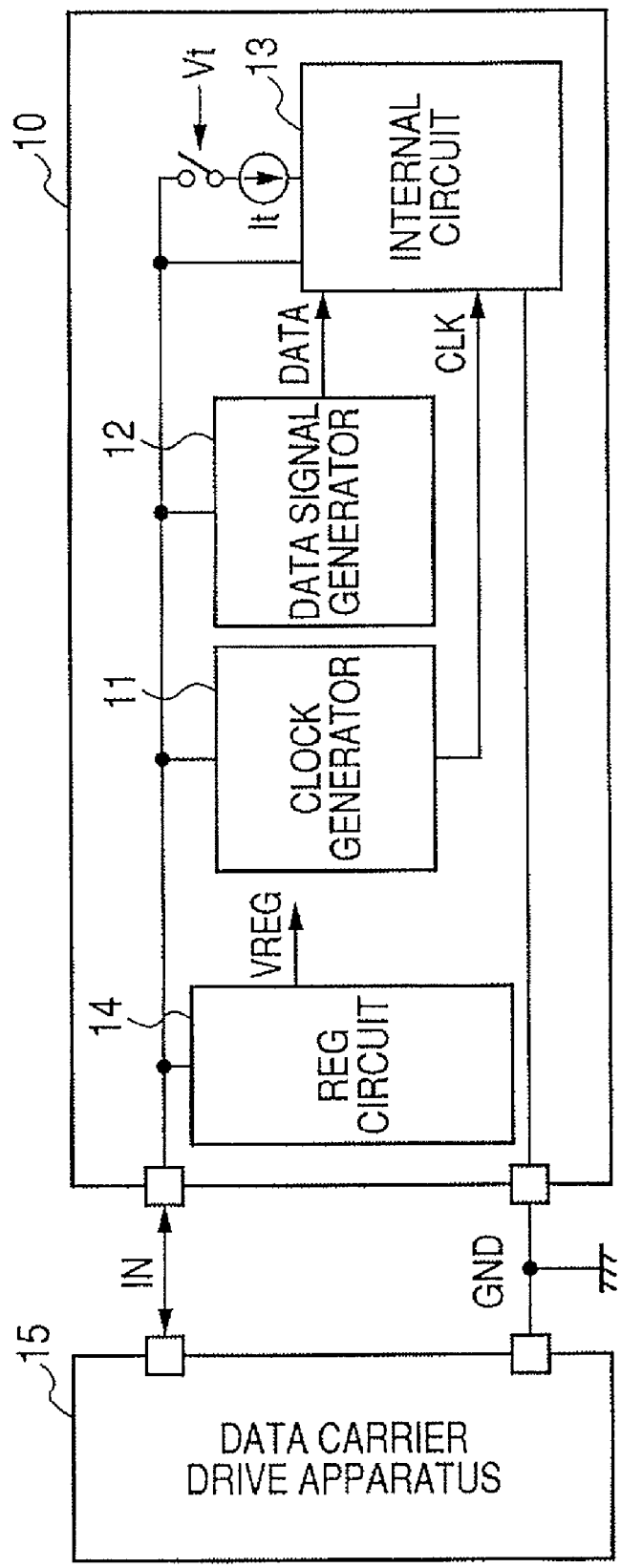
FIG. 1 illustrates an example of the configuration of the data carrier device and its drive device according to a first embodiment of the present invention.

FIG. 1 is a block diagram showing the data communication system including a data carrier device (data communication device) 10 and its drive device (data communication device) 15 according to a first embodiment of the present invention. In FIG. 1, the data carrier device 10 performs data communications with the control device (data carrier drive device) 15 using two connection points, and has two terminals of an IN terminal (signal terminal) and a ground (GND) terminal (reference voltage terminal). The data carrier drive device 15 functions as a control device. The data carrier drive device 15 and the data carrier device 10 are connected by only two connection points of the IN terminal and the GND terminal, and perform the data communication through the two connection points. The data carrier device 10 generates the power supply for all circuits forming the data carrier device 10 from a signal input between the IN terminal and the GND terminal of the data carrier device 10 from the data carrier drive device 15. The data carrier device 10 includes a regulator circuit 14, a clock generation circuit 11, a data signal generation circuit 12, and an internal circuit 13. The regulator circuit 14 generates a power supply voltage VREG of the circuits (the clock generation circuit 11, the data signal generation circuit 12, and the internal circuit 13) configuring the data carrier device 10 from a signal input between the IN terminal and the GND terminal.

The clock generation circuit 11 generates a clock signal CLK required for the data communication from a signal input from the IN terminal. The data signal generation circuit 12 generates a data signal DATA required for the data communication from a signal input from the IN terminal. The internal circuit 13 receives the clock signal CLK and the data signal DATA based on which the circuit performs the data communication with the data carrier drive device 15. The internal circuit 13 has a unit for drawing or supplying a constant current It. The internal circuit 13 ON/OFF controls the constant current It according to a control signal Vt, and the data carrier drive device 15 detects the presence/absence of the constant current It, thereby generating a data signal to be transmitted from the data carrier device 10.

The data carrier drive device 15 has a voltage amplitude modulation circuit for outputting a transmission signal having portions of different duty ratios and a constant pulse frequency based on data to the control circuit 10 through the IN terminal. Furthermore, the data carrier drive device 15 has a current detection circuit for generating a data signal based on the current flowing through the IN terminal.

Next, the operation of the system shown in FIG. 1 is described below by referring to the timing chart shown in FIG. 2. The IN terminal of the data carrier device 10 receives a pulse voltage from the data carrier drive device 15.

The pulse voltage has a constant frequency of a high level (H level) of V1 and a low level (L level) of V2 of voltage amplitude, and has two values, that is, duty 1 and duty 2 of the H level period (duty) of a pulse. A pulse of duty 1 is different in duty ratio from a pulse of duty 2. The GND terminal is connected to the GND potential.

At this time, the V2 as the L level of the pulse voltage is sufficiently large for the output voltage of the regulator circuit 14. The output voltage of the regulator circuit 14 is the power supply voltage of another circuit, and the operation is performed with a constant voltage independent of the pulse voltage input to the IN terminal of the data carrier device 10. The clock generation circuit 11 generates a clock signal CLK using the pulse voltage input to the IN terminal. For example, the clock signal CLK is generated with the rise of a pulse voltage synchronized to the rise of the clock signal CLK. The frequency of the clock signal CLK is the same as the frequency of the pulse voltage input to the IN terminal.

The data signal generation circuit 12 identifies whether the H level period (duty) of the pulse voltage input to the IN terminal of the data carrier device 10 is duty 1 or duty 2 (identifies the duty ratio). Then, the data signal generation circuit 12 generates a corresponding signal as a data signal DATA. The data signal DATA maintains the output at the H level if the voltage of the IN terminal is at the H level and maintains the output at the L level if the voltage of the IN terminal is at the L level when at the fall of the clock signal CLK. The generated clock signal CLK and the data signal DATA are input to the internal circuit 13 of the data carrier device 10 shown in FIG. 1, thereby performing data communications with the control device 15.

The internal circuit 13 is connected to the IN terminal. The internal circuit 13 has a switch circuit for drawing or outputting the constant current It as a data transmission unit (transmission circuit) for the data carrier drive device 15, and outputs a transmission signal to the IN terminal. The switch circuit can be provided outside the internal circuit 13 as shown in FIG. 1. The constant current It is ON/OFF controlled according to the control signal Vt of the switch circuit. The data carrier drive device 15 inserts resistance, for example, between the voltage supply terminal of the data carrier drive device 15 and the IN terminal of the data carrier device 10, and detects the potential difference occurring in the resistance by the constant current It, thereby detecting the presence/absence of the constant current It. Thus, the data carrier drive device 15 receives a data signal from the data carrier device 10.

Figure 2:
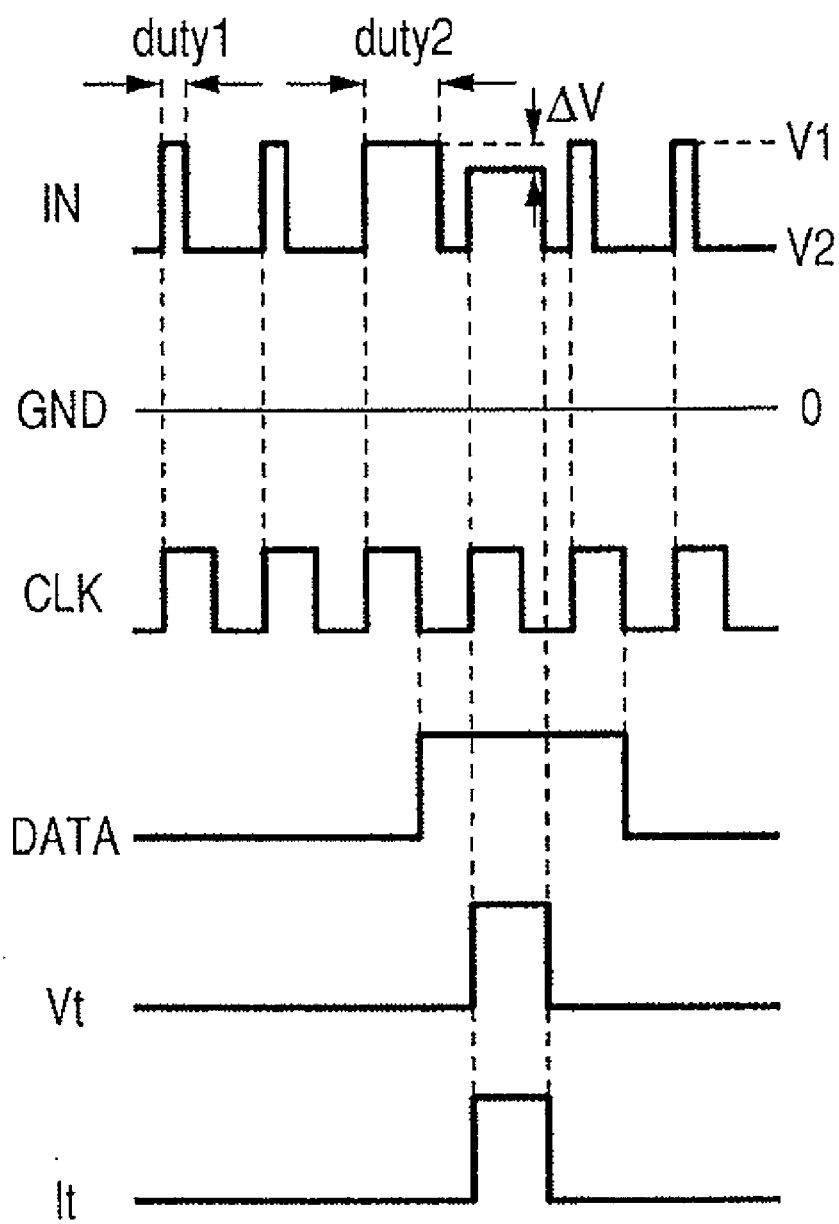
FIG. 2 is a timing chart showing the operation with the configuration shown in FIG. 1.

At this time, as shown in the timing chart in FIG. 2, it is effective to limit the period of drawing or outputting the constant current It (output a transmission signal) in the data carrier device 10 to the H level period of the voltage amplitude of the pulse voltage input to the IN terminal of the data carrier device 10. For example, when the constant current It is drawn from the data carrier device 10, resistance is inserted between the data carrier drive device 15 and the IN terminal as a data signal reception unit from the data carrier device 10 in the data carrier drive device 15 as described above. Then, a voltage drop $\Delta V$ occurs by the resistance value and the constant current It. All circuits configuring the data carrier device 10 generates the power supply of the circuits based on the voltage between the IN terminal and the GND terminal. Therefore, when the voltage amplitude of the pulse voltage input to the IN terminal of the data carrier device 10 draws the constant current It in the L level period, a voltage drop occurs by the resistance inserted when the constant current It is drawn. As a result, the effective voltage between the IN terminal and the GND terminal drops. Therefore, the power supply voltage of the internal circuit in the data carrier device 10 drops, and possibly interferes with a stable operation.

Assume that a method of detecting a voltage value generated in resistance connected to the IN terminal is used as a data signal reception unit from the data carrier device 10. In this case, as a method of improving the detection precision for a certain constant current It, it is effective to increase the voltage value generated in resistance by raising the resistance value related to the IN terminal. However, in this case, the voltage drop value by the resistance when the constant current It is drawn also increases. As a result, the effective voltage between the IN terminal and the GND terminal largely drops, thereby possibly interfering with a stable operation of an internal circuit in the data carrier device 10. Therefore, it is effective to limit the period in which the constant current It is drawn in the H level period of the voltage amplitude of the pulse voltage input to the IN terminal with a moderate restriction of an operation voltage condition.

Figure 3:
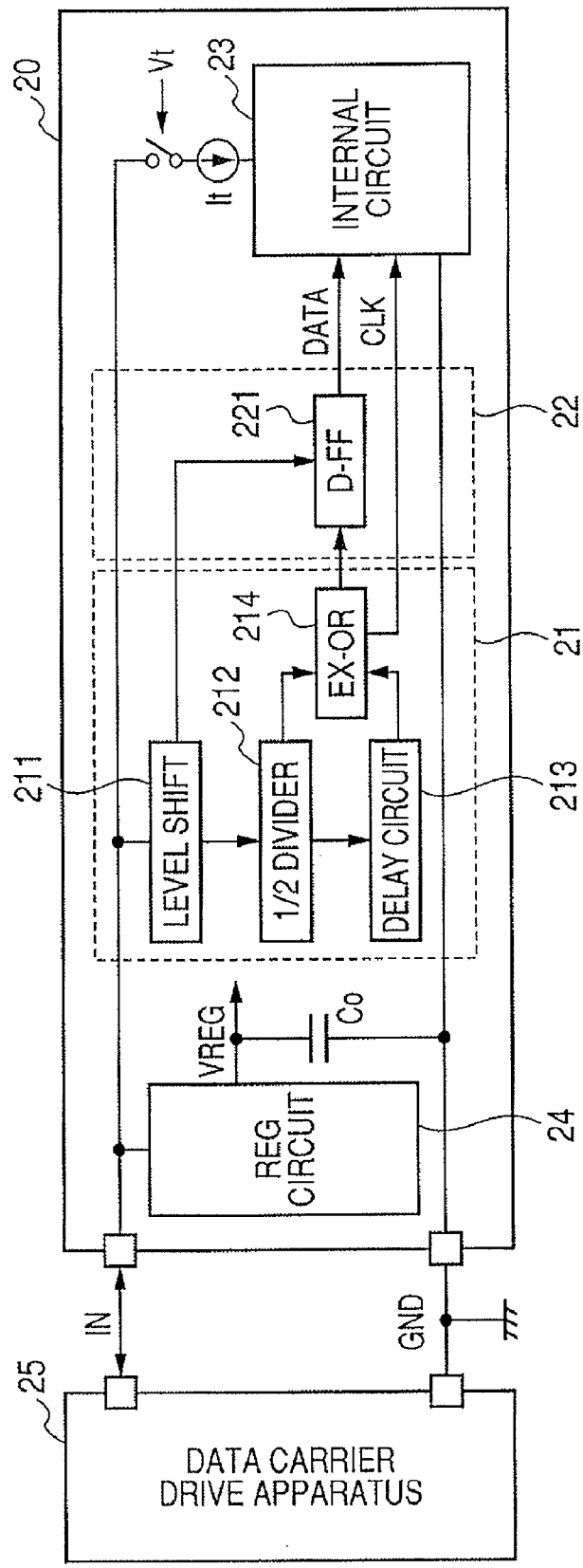
FIG. 3 more practically illustrates the configuration of the data carrier device and its drive device according to the first embodiment of the present invention.

FIG. 3 is a block diagram showing the data communication system including the data carrier device and its drive device according to the present embodiment of the present invention, and practically illustrates the configuration shown in FIG. 1. In FIG. 3, a data carrier device 20 performs data communications with a control device (data carrier drive device) 25 using two connection points, and has two terminals, that is, an IN terminal and a GND terminal. The data carrier drive device 25 functions as a control device. The data carrier drive device 25 and the data carrier device 20 are connected by only two connection points, that is, the IN terminal as a signal terminal and the GND terminal as a reference voltage terminal, and perform data communications through the two connection points. A regulator circuit 24 in the data carrier device 20 generates a constant voltage VREG from a signal input between the IN terminal and the GND terminal of the data carrier device 20 from the data carrier drive device 25. Then, the regulator circuit 24 supplies a power supply voltage to all circuits configuring the data carrier device 20. The data carrier device 20 also includes a clock generation circuit 21, a data signal generation circuit 22, and an internal circuit 23. The clock generation circuit 21 generates a clock signal CLK required for data communications from a signal input from the IN terminal. The data signal generation circuit 22 generates a data signal DATA required for data communications from a signal input from the IN terminal. The internal circuit 23 receives the clock signal CLK and the data signal DATA, and performs data communications with the data carrier drive device 25 based on the signals. The internal circuit 23 has a unit for drawing or outputting a constant current It, and ON/OFF controls the constant current It according to the control signal Vt. The data carrier drive device 25 receives a data signal from the data carrier device 20 by detecting the presence/absence of the constant current It.

When the H level and the L level of a signal input between the IN terminal and the GND terminal of the data carrier device 20 are respectively V1 and V2, the regulator circuit 24 generates the voltage VREG lower than the L level V2, and holds it in the internal capacity Co. The output voltage VREG is a power supply voltage of the circuit configuring the data carrier device 20. The clock generation circuit 21 includes, as an example of a practical circuit, a level shift circuit 211, a ½ frequency division circuit 212, a delay circuit 213, and an EX-OR (exclusive logical sum) circuit 214. The level shift circuit 211 converts the voltage amplitude of the pulse voltage input to the IN terminal of the data carrier device 20 from the data carrier drive device 25 into the voltage VREG (=V3) as an output voltage of the regulator circuit 24 and the GND terminal potential as a reference voltage terminal. That is, the level shift circuit 211 shifts the level of the pulse voltage of the IN terminal to the voltage VREG and the GND terminal potential. The ½ frequency division circuit 212 divides a signal from the level shift circuit 211 for a ½ frequency. The delay circuit 213 delays the signal from the ½ frequency division circuit 212. The EX-OR (exclusive logical sum) circuit 214 performs EX-OR arithmetic (result of logical arithmetic) according to the two output signals from the ½ frequency division circuit 212 and the delay circuit 213, and outputs a clock signal CLK for operation of the internal circuit 23. The data signal generation circuit 22 includes a D flip-flop circuit 221 as an example of a practical circuit. The D flip-flop circuit 221 receives a signal from the EX-OR (exclusive logical sum) circuit 214 as a clock signal CLK, and receives a signal from the level shift circuit 211, thereby operating in synchronization with the clock signal CLK. Then, the D flip-flop circuit 221 determines whether the signal from the level shift circuit 211 is at the H level or the L level, and outputs a corresponding output signal as a data signal DATA for performing data communications with the data carrier drive device 25.

Figure 4:
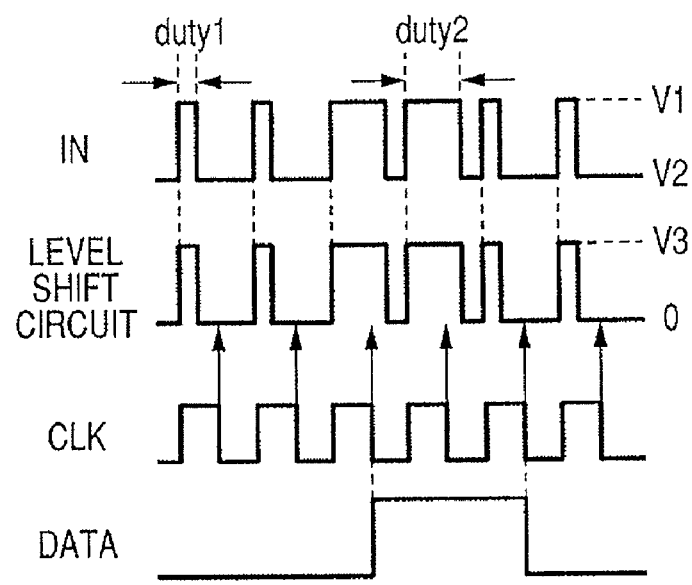
FIG. 4 is a timing chart showing the operation with the configuration shown in FIG. 3.

Next, the operation of the system shown in FIG. 3 is described below by referring to the timing chart shown in FIG. 4. The IN terminal receives a pulse voltage having two values of duty 1 and duty 2 in the H level period (duty) of a pulse with a constant frequency at the H level of V1 and the L level of V2 of the voltage amplitude. At this time, the V2 at the L level of the pulse voltage is sufficiently large with respect to the output voltage VREG of the regulator circuit 24. The voltage amplitude of the pulse voltage input to the IN terminal is converted by the level shift circuit 211 such that, for example, the H level can be VREG (=V3) and the L level can be the GND potential as the reference voltage terminal.

Figure 5:
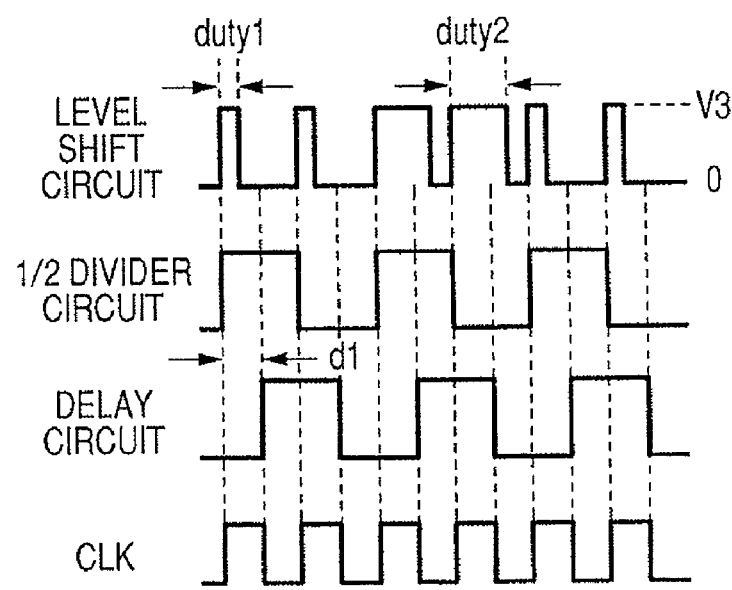
FIG. 5 is a timing chart showing the operation of the clock generation circuit shown in FIG. 3.

The operation of the clock generation circuit 21 is described by referring to the timing chart shown in FIG. 5. The ½ frequency division circuit 212 divides the output signal from the level shift circuit 211 into ½ frequency. The output signal from the ½ frequency division circuit 212 is switched between the H level and the L level in synchronization with the rise of the output signal from the level shift circuit 211. The frequency of the output signal from the ½ frequency division circuit 212 is set only by the frequency of the output signal from the level shift circuit 211.

Next, the delay circuit 213 inputs the output signal from the ½ frequency division circuit 212, and outputs the signal with a delay of a predetermined time d1. The EX-OR circuit 214 inputs the output signal from the ½ frequency division circuit 212 and the output signal from the delay circuit 213, and performs EX-OR arithmetic. Then, the EX-OR circuit 214 can generate a clock signal CLK having the same frequency as the output signal from the level shift circuit 211 and in synchronization with the rise timing of the output signal from the level shift circuit 211. For example, the delay time d1 is set to ½ of the period of the pulse voltage input to the IN terminal of the data carrier device 20 from the data carrier drive device 25. Then, the EX-OR circuit 214 can generate a clock signal CLK having the same frequency as the pulse voltage input to the IN terminal, and indicating the duty ratio of 50%.

Then, the output signal from the EX-OR circuit 214 as a clock signal CLK and the output signal from the level shift circuit 211 as an output signal are input to the D flip-flop circuit 221 as the data signal generation circuit 22. As shown in the timing chart in FIG. 4, the falling edge of the clock signal CLK is defined as a clock signal for operation of the D flip-flop circuit 221. Then, in synchronization with the fall of the clock signal CLK, the D flip-flop circuit 221 operates corresponding to the H level or the L level of the signal from the level shift circuit 211. For example, if the signal from the level shift circuit 211 is the H level, the output signal of the D flip-flop circuit 221 is the H level. If the signal from the level shift circuit 211 is the L level, the output signal of the D flip-flop circuit 221 is the L level. Thus, the output signal of the D flip-flop circuit 221 is switched. The duty ratio of the pulse voltage input to the IN terminal of the data carrier device 20 determines whether the signal from the level shift circuit 211 is at the H level or the L level at the falling edge of the clock signal CLK. Therefore, the switch of the output signal of the D flip-flop circuit 221 corresponds to the switch of the duty ratio of the pulse voltage input to the IN terminal. Therefore, the duty ratio of the pulse voltage input to the IN terminal is controlled as the data signal from the data carrier drive device 25, and the duty ratio is identified by the D flip-flop circuit 221. Thus, the output signal of the D flip-flop circuit 221 can be a data received signal from the data carrier drive device 25.

The clock signal CLK as an output signal from the clock generation circuit 21 and the data signal DATA as an output signal from the data signal generation circuit 22 are input to the internal circuit 23 shown in FIG. 3, thereby performing data communications with the data carrier drive device 25. Thus, the internal circuit 23 has a circuit for drawing or outputting the constant current It as a data transmission unit to the data carrier drive device 25. The data carrier drive device 25 detects the current from the data carrier device 20 as, for example, a potential difference between the resistance units inserted between the voltage supply terminal of the data carrier drive device 25 and the IN terminal of the data carrier device 20. Thus, the data carrier drive device 25 receives the data signal from the data carrier device 20.

Figure 22:
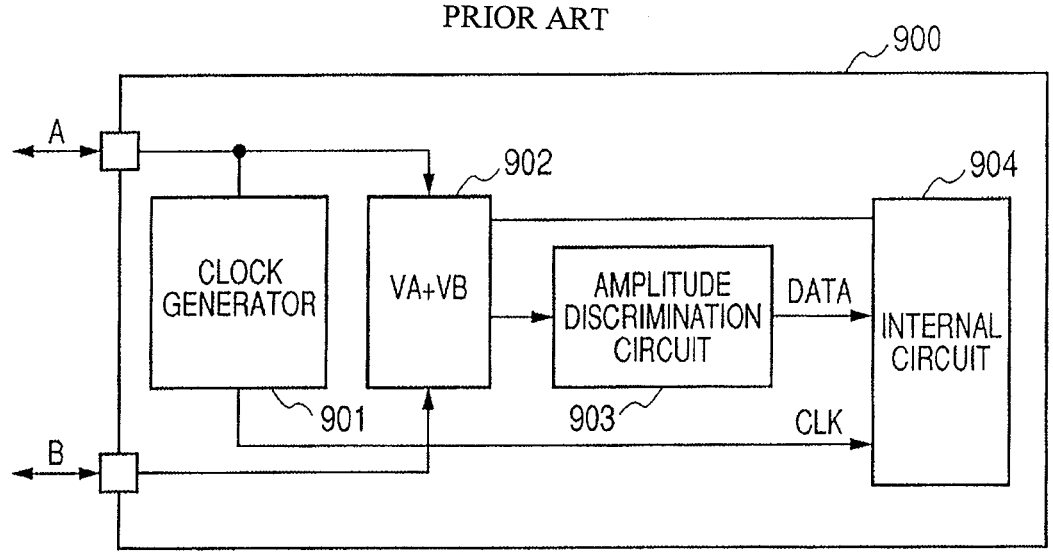
FIG. 22 illustrates an example of the configuration of the data communication system used with the conventional two connection points.
Figure 23:
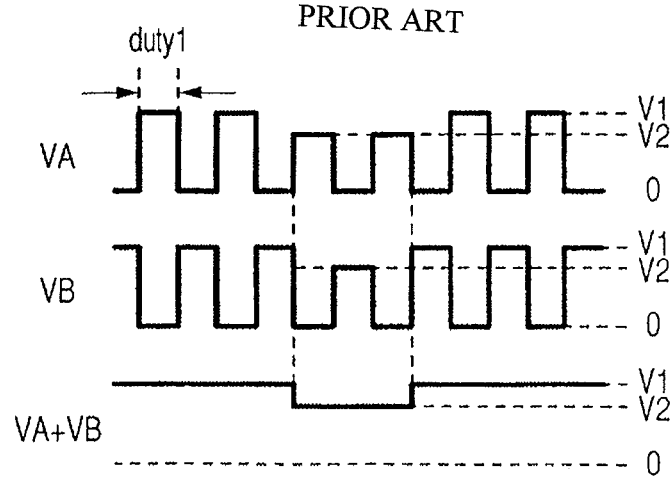
FIG. 23 is a timing chart showing the operation of the system shown in FIG. 22.
Figure 24:
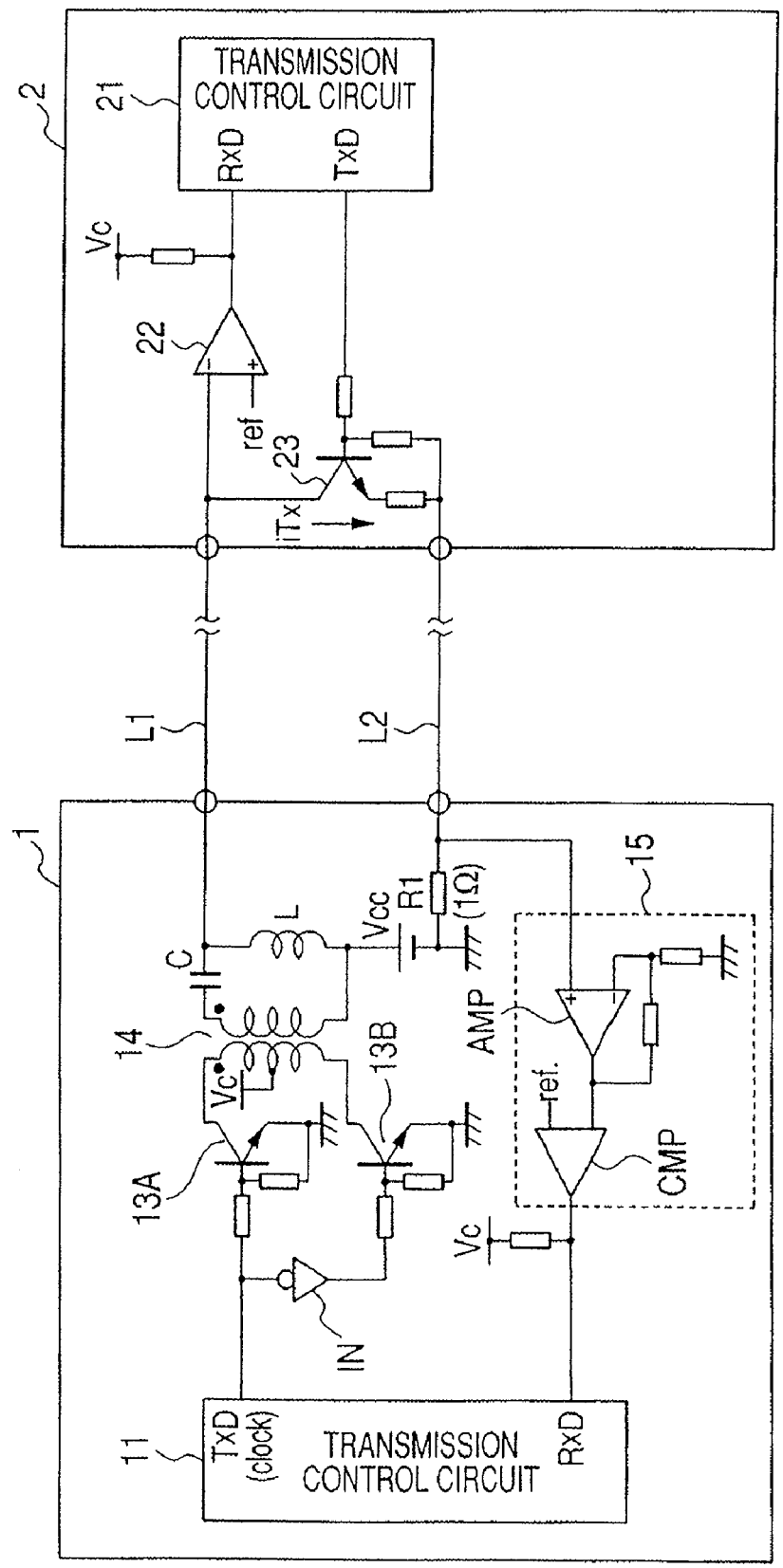
FIG. 24 illustrates an example of the configuration of the data communication system used with the conventional two connection points.
Figure 25:
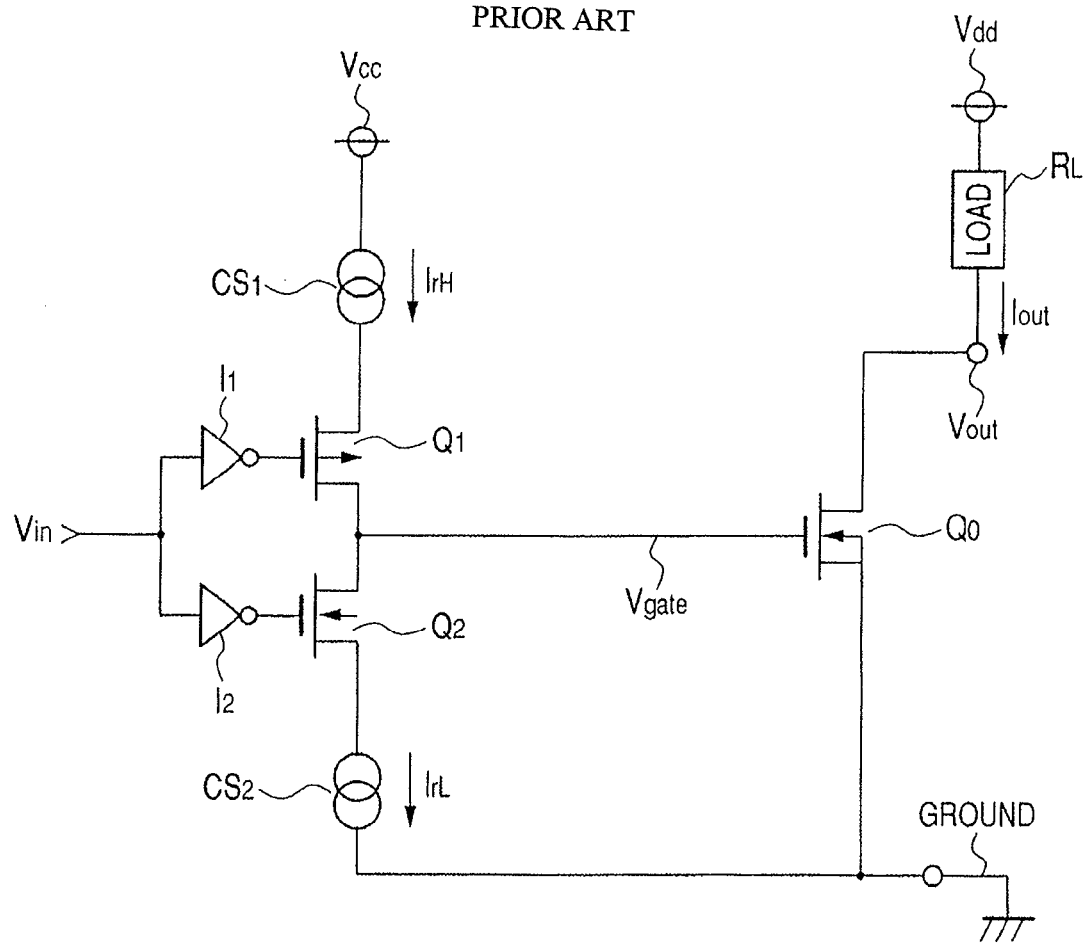
FIG. 25 illustrates and example of the configuration in which the output waveform of the conventional constant current circuit slowly changes.

According to the present embodiment of the present invention, two pulse voltages having opposite phases are not supplied as they are in the data carrier device for performing data communications using only two terminals shown in FIGS. 22 and 23. Therefore, there arises no period in which power is not supplied to the data carrier device when there is a phase difference between two applied pulse voltages. As a result, power supply required to operate an internal circuit can be supplied in a stable state. Then, a malfunction of the internal circuit that can occur at the momentary bottom of power supply can be avoided.

The frequency of the clock signal CLK generated by the clock generation circuit 21 of the data carrier device 20 can be synchronized to the frequency of the pulse voltage input to the IN terminal of the data carrier device 20 from the data carrier drive device 25. Therefore, although a set value of the frequency of the pulse voltage input to the IN terminal of the data carrier device 20 from the data carrier drive device 25 is changed or fluctuated, the clock signal CLK generated by the clock generation circuit 21 of the data carrier device 20 is synchronized to the frequency. Therefore, it is not necessary to prepare precise timing design, and the entire system design can be easily made.

Furthermore, the data carrier drive device 25 is generally configured by a general-purpose microcomputer in many cases, and the frequency of the clock signal for driving the microcomputer has a very high frequency in MHz unit or higher. The frequency of the clock signal is sufficiently high as compared with the pulse voltage input to the IN terminal of the data carrier device 20 from the data carrier drive device 25. Therefore, using the clock signal for drive of the microcomputer, the H level period (duty) of the pulse voltage input to the IN terminal of the data carrier device 20 from the data carrier drive device 25 can be easily controlled. This also enables the entire system design to be easily made without precise timing design and the like.

Furthermore, there is a circuit configuration of drawing or outputting the constant current It as a data transmission unit to the data carrier drive device, and a method of performing a short circuit is not used with a view to impedance-converting the power supply of the circuit configuring a data carrier device. Since the potential of at least V2 is applied to the pulse voltage input to the IN terminal, a stable circuit operation that hardly falls into a malfunction can be realized with low noise.

Also in a power supply voltage having a pulse amplitude with high noise component as a voltage input to the IN terminal of the data carrier device 20, the output voltage of the regulator circuit 24 is used as a power supply voltage of an internal circuit. Therefore, a stable operation of the internal circuit can be realized, and a new terminal for supply of a power supply voltage to the internal circuit is not required, thereby possibly configuring a system at a low cost.

Assume that the internal circuit of the data carrier device 20 is operated in synchronization with the clock signal generated by the clock generation circuit 21 of the data carrier device 20. In this case, since a current of large consumption transiently flowing when the internal circuit operates is momentarily supplied from the internal capacity Co for holding the regulator output voltage VREG, the regulator output voltage VREG decreases. Then, the regulator circuit 24 detects the decrease of the output voltage, the feedback is applied to raise the output voltage, and the regulator output voltage rises. However, in the present embodiment of the present invention, a signal having a constant frequency is input to the IN terminal. Therefore, the frequency of the clock signal generated by the clock generation circuit 21 of the data carrier device 20 becomes constant. As a result, the decrease of the regulator output voltage generated by operating the internal circuit in synchronization with the clock signal and the frequency also becomes constant. The speed of the response to which a feedback is applied to raise the regulator output voltage requested for the regulator circuit has to be designed only to be sufficiently fast with respect to the frequency, thereby easily realizing the design of the regulator circuit 24. The stable operation of the internal circuit of the data carrier device 20 can be realized with the output voltage VREG of the regulator circuit 24 used as a power supply voltage.

Also, since the clock generation circuit 21 and the data signal generation circuit 22 are mostly configured by logical circuits, the circuit can be free of an unstable operation caused depending on a subtle change of analog potential. Therefore, under the power supply voltage input to the IN terminal as having pulse amplitude and including high noise components or with the configuration of the circuit having high noise components caused when an internal circuit operates in synchronization with a clock signal, a sufficiently stable circuit operation can be realized.

In the data signal generation circuit 22, the delay time of the delay circuit 213 for determining the timing is used only to identify the duty ratio of the pulse voltage input to the IN terminal of the data carrier device 20 from the data carrier drive device 25. Therefore, when the duty ratio of the pulse voltage input to the IN terminal is sufficiently different from each other, it is not necessary to strictly set a delay time, thereby realizing a delay circuit with a circuit of a simple configuration.

Second Embodiment of the Present Invention

Figure 6:
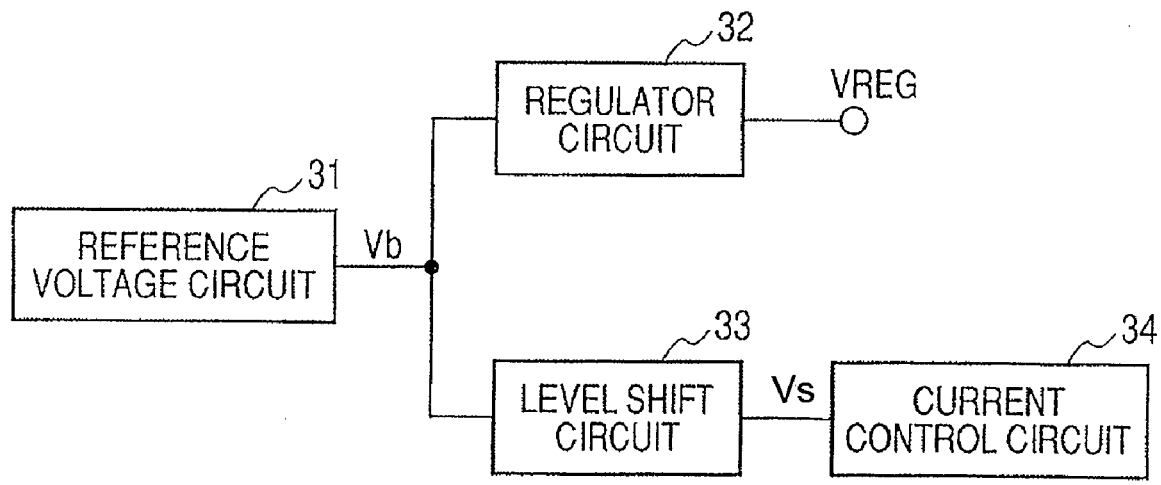
FIG. 6 illustrates an example of the configuration of the circuit according to a second embodiment of the present invention.

FIG. 6 is a block diagram showing an example of the configuration of the data carrier device 20 according to a second embodiment of the present invention. The data carrier device 20 includes a regulator circuit 32 for outputting a power supply voltage of an internal circuit, a level shift circuit 33 in the clock generation circuit 21, a reference voltage circuit 31 for generating a reference voltage Vb of the circuits, and a current control circuit 34. The reference voltage Vb is a voltage generated in the data carrier device 20, and is generated by a band gap reference voltage generation circuit for generating, for example, a band gap reference voltage. The current control circuit 34 corresponds to the switch circuit in the internal circuit 13 shown in FIG. 1, and controls the current as a data transmission unit according to the output signal Vs of the level shift circuit 33. FIG. 6 illustrates the configuration of the circuit including the reference voltage circuit 31, the regulator circuit 32, the level shift circuit 33, and the current control circuit 34 for controlling the current as a data signal transmission unit. The output voltage Vb from the reference voltage circuit 31 is input as a reference voltage to the regulator circuit 32 and the level shift circuit 33. Furthermore, the output signal Vs of the level shift circuit 33 is input to the current control circuit 34 for controlling the current as a data transmission unit.

The operation of the circuit shown in FIG. 6 is described below by referring to the timing chart shown in FIG. 7. The IN terminal of the data carrier device 20 receives a pulse voltage having two values, that is, duty 1 and duty 2 for the H level period (duty) of a pulse with a constant frequency of V1 for the H level and V2 for the L level of the voltage amplitude. The data carrier device 20 has a switch circuit for drawing or outputting a constant current It as a data transmission unit to the data carrier drive device 25. The data carrier drive device 25 inserts resistance, for example, between the voltage supply terminal of the data carrier drive device 25 and the IN terminal of the data carrier device 20, and detects the potential difference ΔV occurring in the resistance by the constant current It, thereby detecting the presence/absence of the constant current It. Thus, the data carrier drive device 25 receives a data signal from the data carrier device 20.

Figure 7:
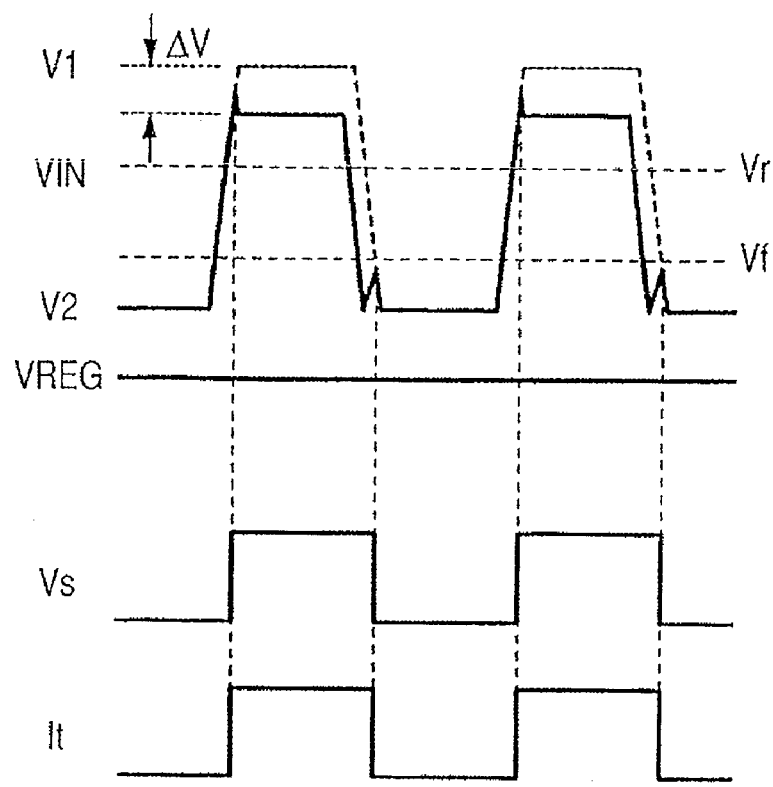
FIG. 7 is a timing chart showing the operation of the circuit shown in FIG. 6.

At this time, as shown in the timing chart in FIG. 7, it is effective to limit the period of drawing or outputting the constant current It in the data carrier device 20 to the H level period of the voltage amplitude of the pulse voltage VIN input to the IN terminal of the data carrier device 20. For example, when the constant current It is drawn, resistance is inserted between the data carrier drive device 25 and the IN terminal as a data signal reception unit from the data carrier device 20 in the data carrier drive device 25 as described above. Then, a voltage drop $\Delta V$ occurs by the resistance value and the constant current It. When the constant current It is drawn in the L level period of the voltage amplitude of the pulse voltage VIN input to the IN terminal of the data carrier device 20, all circuits configuring the data carrier device 20 generates the power supply voltage of the circuits based on the voltage between the IN terminal and the GND terminal. Therefore, a voltage drop occurs by the resistance inserted when the constant current It is drawn. As a result, the effective voltage between the IN terminal and the GND terminal drops. Therefore, the power supply voltage of the internal circuit in the data carrier device 20 drops, and possibly interferes with a stable operation. Assume that a method of detecting a voltage value generated in resistance connected to the IN terminal is used as a data signal reception unit from the data carrier device 20. In this case, as a method of improving the detection precision for a certain constant current It, it is effective to increase the voltage value generated in resistance by raising the resistance value connected to the IN terminal. However, in this case, the voltage drop value by the resistance when the constant current It is drawn also increases. As a result, the effective voltage between the IN terminal and the GND terminal largely drops, thereby possibly interfering with a stable operation of an internal circuit in the data carrier device 20. Therefore, it is effective to limit the period in which the constant current It is drawn in the H level period of the voltage amplitude of the pulse voltage input to the IN terminal with a moderate restriction of an operation voltage condition.

A method of detecting whether the voltage amplitude input to the IN terminal is the H level or the L level by detecting an absolute value of a voltage having a rise threshold voltage Vr at the rise time of the voltage input to the IN terminal, and a fall threshold voltage Vf at the fall time via the level shift circuit 33 can be used. With the circuit configuration, when the rise threshold voltage Vr and the fall threshold voltage Vf are set based on the reference voltage Vb from the reference voltage circuit 31, the following operation is performed as shown by the timing chart of FIG. 7. First, when the L level of the amplitude of the voltage VIN input to the IN terminal changes to the H level of the amplitude of the voltage VIN input to the IN terminal, the state in which the rise threshold voltage Vr has been exceeded is detected. Upon the detection, the output signal Vs of the level shift circuit 33 that has an initialized L level enters the H level. Next, when the voltage amplitude input to the IN terminal changes from the H level to the L level, the state in which the fall threshold voltage Vf has been exceeded (has not been reached) is detected, and the output signal Vs of the level shift circuit 33 enters the L level. The output signal Vs from the level shift circuit 33 is input to the current control circuit 34 for controlling the current as a data transmission unit. Then, in the H level of the output signal Vs from the level shift circuit 33, that is, when the amplitude of the voltage VIN input to the IN terminal is in the H level, the current It as a data transmission unit flows under control.

When the current It flows as a data transmission unit, and the data carrier drive device 25 inserts resistance into the space to the IN terminal as a unit for receiving the data signal from the data carrier device 20, the voltage drop $\Delta V$ is caused by the resistance value and the current It. In the level shift circuit 33, there is a response time of the circuit from the detection that the voltage input to the IN terminal has exceeded the rise threshold voltage Vr or the fall threshold voltage Vf to the switch of the output signal Vs. Therefore, with the response time and the voltage drop $\Delta V$ by the resistance value and the current It taken into account, the following operation is performed as shown by the timing chart of FIG. 7. When the amplitude of the voltage VIN input to the IN terminal changes from the L level to the H level, the state in which the rise threshold voltage Vr has been exceeded is detected, the output signal Vs from the level shift circuit 33 is switched to the H level, and the current It as a data transmission unit starts flowing. To generate the voltage drop $\Delta V$ by the resistance value and the current It as a data signal reception unit, the amplitude of the voltage VIN input to the IN terminal is to be sufficiently higher than the rise threshold voltage Vr. Similarly, when the voltage amplitude input to the IN terminal changes from the H level to the L level, the state in which the fall threshold voltage Vf has been exceeded is detected, the output signal Vs from the level shift circuit 33 is switched to the L level, and the current It as a data transmission unit stops flowing. To stop the voltage drop $\Delta V$ by the resistance value and the current It as a data signal reception unit, the amplitude of the voltage VIN input to the IN terminal is to be sufficiently lower than the fall threshold voltage Vf.

As shown in FIG. 6, the output voltage Vb from the reference voltage circuit 31 is input as a reference voltage to the regulator circuit 32 and the level shift circuit 33. By the reference voltage Vb, the output voltage VREG of the regulator circuit 32, and the rise threshold voltage Vr and the fall threshold voltage Vf of the level shift circuit 33 are set. Therefore, the output voltage VREG, the rise threshold voltage Vr, and the fall threshold voltage Vf are correlated with the reference voltage Vb.

Figure 8:
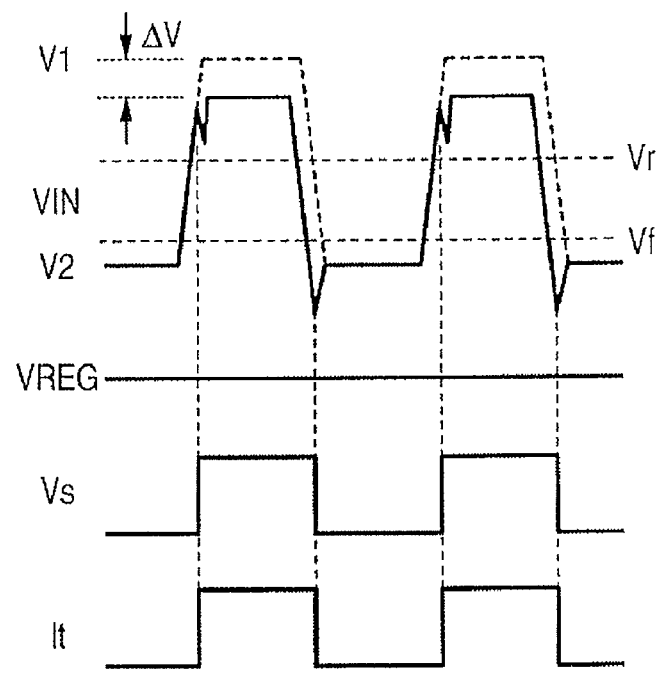
FIG. 8 is a timing chart showing the operation of the circuit shown in FIG. 6.

Therefore, when the output voltage Vb from the reference voltage circuit 31 is low, when the amplitude of the voltage VIN input to the IN terminal changes from the H level to the L level, the fall threshold voltage Vf is low as shown in FIG. 8. Therefore, the state in which the fall threshold voltage Vf has been exceeded is detected, the output signal Vs from the level shift circuit 33 is switched to the L level, and the current It as a data transmission unit stops flowing. To stop the voltage drop $\Delta V$ by the resistance value and the current It as a data signal reception unit, the amplitude of the voltage VIN input to the IN terminal becomes sufficiently lower than the fall threshold voltage Vf, and becomes lower than the L level of the amplitude of the voltage VIN input to the IN terminal.

When the output voltage VREG of the regulator circuit 32 is not correlated with the fall threshold voltage Vf of the level shift circuit 33, the voltage signal VIN input to the IN terminal indicates a voltage lower than the set L level of the voltage amplitude input to the IN terminal. Therefore, the output voltage VREG of the regulator circuit 32 drops, and possibly interferes with the stable operation of another circuit having the output voltage VREG as a power supply voltage. However, in the present embodiment of the present invention, since the output voltage VREG of the regulator circuit 32 is correlated with the fall threshold voltage Vf of the level shift circuit 33, the output voltage VREG of the regulator circuit 32 also becomes low when the output voltage Vb from the reference voltage circuit 31 is low. Thus, the stable operation of another circuit having the output voltage VREG as a power supply voltage can be performed without the influence of the voltage signal VIN input to the IN terminal lower than the set L level of the voltage amplitude input to the IN terminal.

Figure 9:
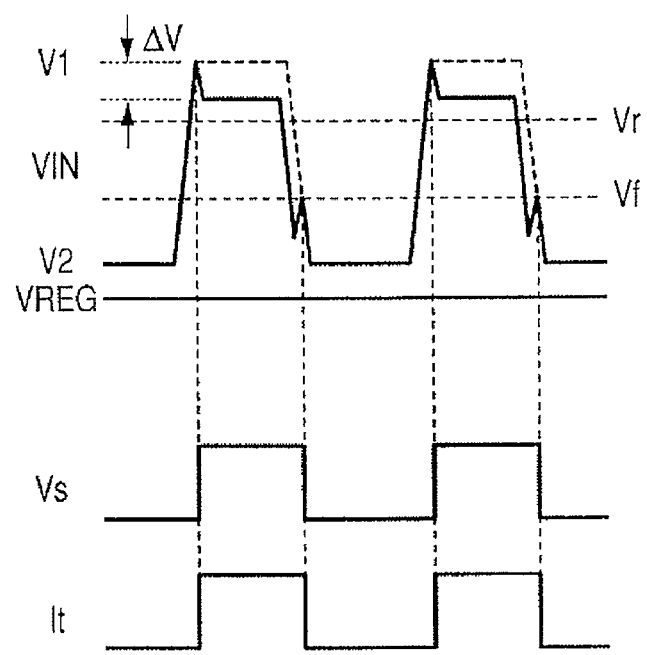
FIG. 9 is a timing chart showing the operation of the circuit shown in FIG. 6.

When the output voltage Vb from the reference voltage circuit 31 is high, the output voltage VREG of the regulator circuit 32 is high as shown in FIG. 9. Normally, when the voltage signal VIN input to the IN terminal becomes lower than the set L level of the voltage amplitude input to the IN terminal, the output voltage VREG of the regulator circuit 32 becomes low. Therefore, it possibly interferes with the stable operation of another circuit having the output voltage VREG as a power supply voltage. However, according to the present embodiment of the present invention, the output voltage VREG of the regulator circuit 32 is correlated with the fall threshold voltage Vf of the level shift circuit 33. Therefore, when the output voltage Vb from the reference voltage circuit 31 is high, the fall threshold voltage Vf of the level shift circuit 33 is also high. By detecting the state in which the fall threshold voltage Vf has been exceeded, the output signal Vs from the level shift circuit 33 is switched to the L level, and stops the current It as a data transmission unit. The amplitude of the voltage VIN input to the IN terminal when the voltage drop ΔV stops by the resistance value and the current It as a data signal reception unit is sufficiently higher than the set L level of the voltage amplitude input to the IN terminal. Thus, the stable operation of another circuit having the output voltage VREG as a power supply voltage can be performed without the influence of the voltage drop ΔV by the resistance value and the current It as a data signal reception unit.

Therefore, according to the present embodiment of the present invention, the output voltage Vb from the reference voltage circuit 31 is input as a reference voltage to the regulator circuit 32 and the level shift circuit 33. By the reference voltage Vb, the output voltage VREG of the regulator circuit 32, and the rise threshold voltage Vr and the fall threshold voltage Vf of the level shift circuit 33 are set respectively. Since the output voltage VREG, the rise threshold voltage Vr, and the fall threshold voltage Vf are correlated, there is no influence of the voltage drop ΔV by the resistance value and the current It as a data signal reception unit, and the stable operation of another circuit having the output voltage VREG of the regulator circuit 32 as a power supply voltage can be performed. Therefore, data communications can be stably performed without a malfunction.

Third Embodiment of the Present Invention

Figure 10:
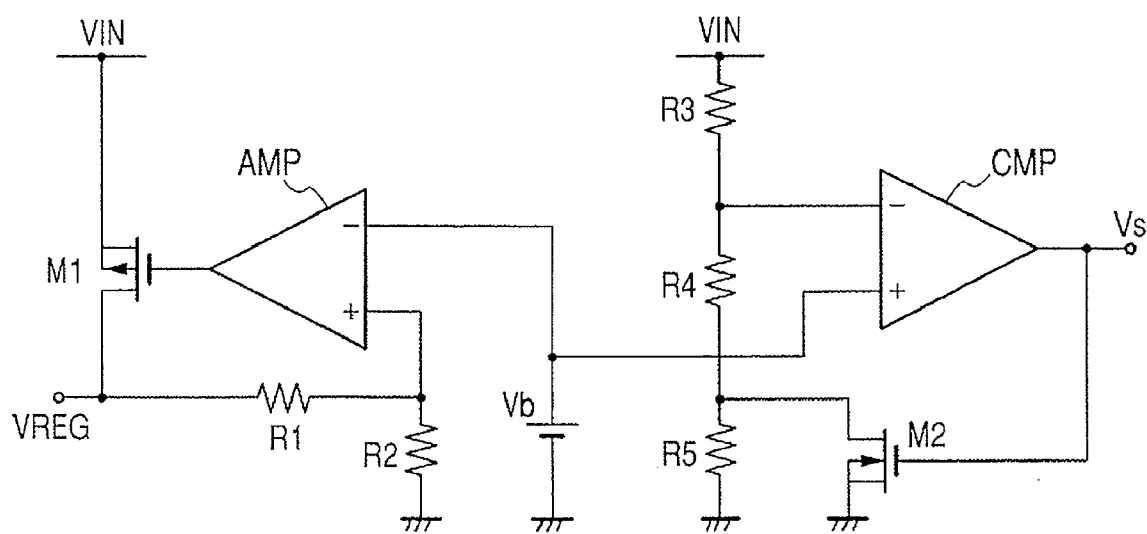
FIG. 10 illustrates examples of the configurations of the circuits of the regulator circuit and the level shift circuit according to a third embodiment of the present invention.

FIG. 10 illustrates examples of circuits of the regulator circuit 32 in the data carrier device 20 and the level shift circuit 33 and the reference voltage circuit 31 in the clock generation circuit 21 according to a third embodiment of the present invention. The present embodiment of the present invention practically shows the regulator circuit 32 and the level shift circuit 33. In the circuit shown in FIG. 10, there is a voltage source Vb as the reference voltage circuit 31. The voltage source Vb is, for example, a band gap reference voltage generation circuit for generating, for example, a band gap reference voltage.

As the regulator circuit 32, the voltage source Vb is input as a reference voltage to a − side input terminal of the amplifier circuit AMP, and the output terminal of the amplifier circuit AMP is connected to the gate terminal of the PMOS (P channel MOS field effect transistor) M1. The source terminal of the transistor M1 is connected to the VIN as a power supply, and the drain terminal of the transistor M1 is connected to the output terminal VREG of the regulator circuit 32. Resistance R1 is connected to a point between the output terminal VREG and a + side input terminal of the amplifier circuit AMP, and resistance R2 is connected to a point between the + side input terminal of the amplifier circuit AMP and the GND potential.

As the level shift circuit 33, the voltage source Vb is input as a reference voltage to the + side input terminal of the comparator circuit CMP, and a voltage obtained by resistance-dividing the power supply voltage VIN by the resistance R3, R4, and R5 is input to the − side input terminal of the comparator circuit CMP. The output terminal of the comparator circuit CMP is output as the output voltage Vs of the level shift circuit 33, and connected to the gate terminal of the hysteresis voltage control NMOS (N channel MOS field effect transistor) M2. The drain terminal of the transistor M2 is connected to the resistance R4 and R5, and the source terminal of the transistor M2 is connected to the GND potential.

The operation of the circuit shown in FIG. 10 is described below. The regulator circuit 32 has the output voltage VREG set by the reference voltage source Vb, and the voltage is calculated as follows.

$VREG=(R1+R2)/R2 \times Vb$

The level shift circuit 33 has the rise threshold voltage Vr and the fall threshold voltage Vf set by the reference voltage source Vb, and the voltage is calculated as follows.

Rise threshold voltage $Vr=(R3+R4)/R4 \times Vb$

Fall threshold voltage $Vf=(R3+R4+R5)/(R4+R5) \times Vb$

The output voltage VREG of the regulator circuit 32 and the rise threshold voltage Vr and the fall threshold voltage Vf of the level shift circuit 33 are set to be proportional to the reference voltage Vb.

Therefore, in the present embodiment of the present invention, the output voltage VREG of the regulator circuit 32 and the rise threshold voltage Vr and the fall threshold voltage Vf of the level shift circuit 33 are correlated. As a result, there is no influence of the voltage drop ΔV by the resistance value and the current It as a data signal reception unit, and the stable operation of another circuit having the output voltage VREG of the regulator circuit 32 as a power supply voltage can be performed. Therefore, data communications can be stably performed without a malfunction.

Fourth Embodiment of the Present Invention

Figure 11:
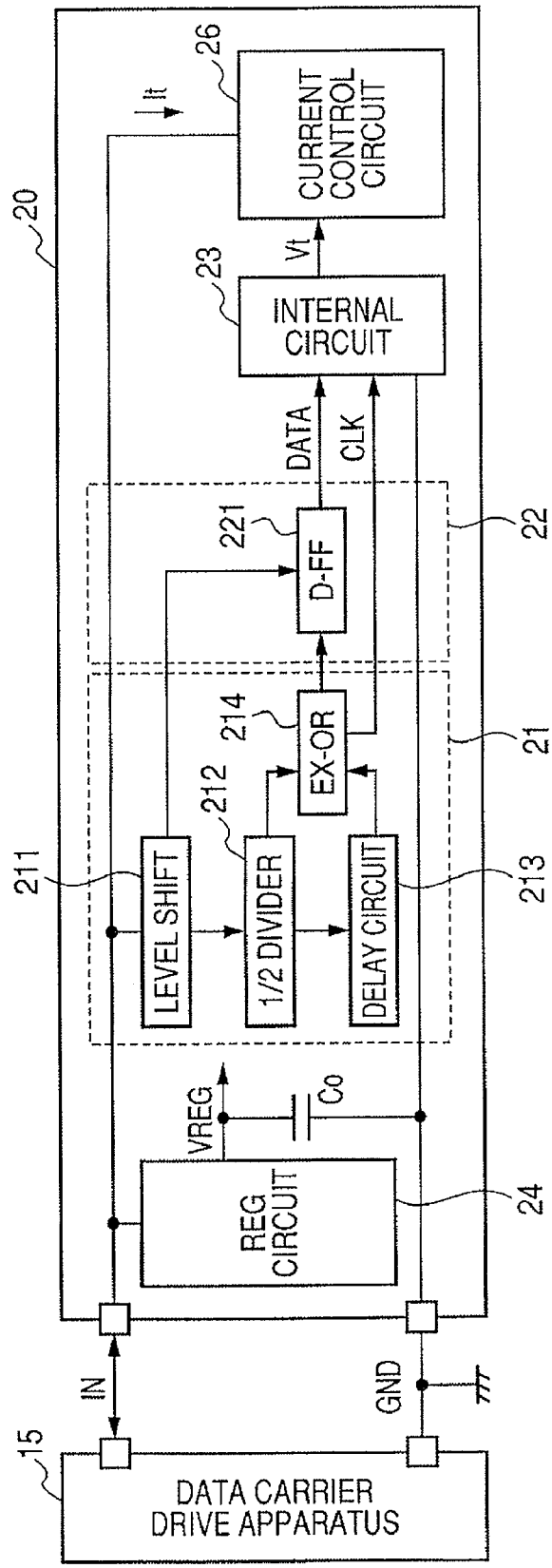
FIG. 11 more practically illustrates the configuration of the data carrier device and its drive device according to a fourth embodiment of the present invention.

FIG. 11 is a block diagram showing the data communication system including the data carrier device 20 and the data carrier drive device 25 according to a fourth embodiment of the present invention, and more practically illustrates the configuration shown in FIG. 1. FIG. 11 is different from FIG. 3 in that it includes a current control circuit 26 in the data carrier device 20, and is the same as FIG. 3 in the other components. The current control circuit 26 corresponds to the current control circuit 34 shown in FIG. 6, inputs a constant current control signal Vt from the internal circuit 23, controls as to whether or not the constant current It flowing through the IN terminal is to be passed or stopped based on the constant current control signal Vt, and outputs the transmission signal to the IN terminal. The internal circuit 23 generates the constant current control signal Vt based on the output signal Vs of a level shift circuit 221.

Figure 12:
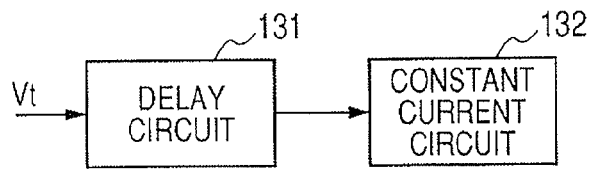
FIG. 12 illustrates an example of the configuration of the current control circuit.

FIG. 12 is a block diagram showing an example of the configuration of the current control circuit 26 in the data carrier device 20 according to the present embodiment of the present invention, and practically illustrates the current control circuit 26 shown in FIG. 11. The current control circuit shown in FIG. 12 includes a delay circuit 131 and a constant current circuit 132. The constant current control signal Vt is input to the delay circuit 131. The delay circuit 131 delays the constant current control signal Vt. The constant current circuit 132 controls whether or not the constant current is to be passed according to the output signal of the delay circuit 131.

The operation of the circuit shown in FIG. 12 is described below by referring to the timing chart shown in FIG. 13. The IN terminal of the data carrier device 20 receives a pulse voltage VIN having two values, that is, duty 1 and duty 2 for the H level period (duty) of a pulse with a constant frequency of V1 for the H level and V2 for the L level of the voltage amplitude. The data carrier device 20 has a switch circuit for drawing or outputting a constant current It as a data transmission unit to the data carrier drive device 25. The data carrier drive device 25 inserts resistance, for example, between the voltage supply terminal of the data carrier drive device 25 and the IN terminal of the data carrier device 20, and detects the potential difference $\Delta V$ occurring in the resistance by the constant current It, thereby detecting the presence/absence of the constant current It. Thus, the data carrier drive device 25 receives a data signal from the data carrier device 20.

Figure 13:
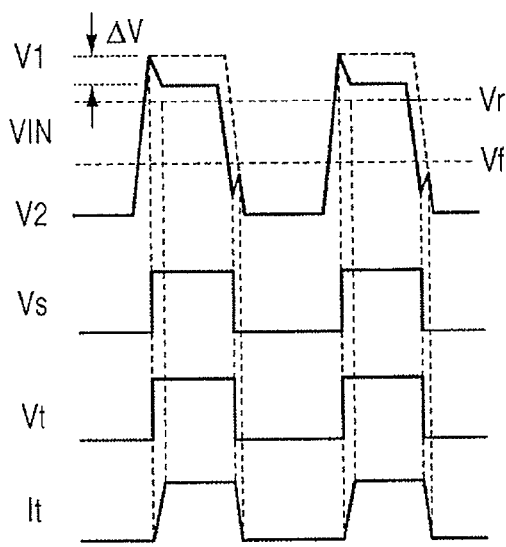
FIG. 13 is a timing chart showing the operation of the current control circuit shown in FIG. 12.

At this time, as shown in the timing chart in FIG. 13, it is effective to limit the data carrier device 20 drawing or outputting the constant current It to the H level period of the voltage amplitude of the pulse voltage VIN input to the IN terminal of the data carrier device 20. For example, when the constant current It is drawn, resistance is inserted between the data carrier drive device 25 and the IN terminal as a data signal reception unit from the data carrier device 20 as described above. Then, a voltage drop $\Delta V$ occurs by the resistance value and the constant current It. All circuits configuring the data carrier device 20 generates the power supply voltage of the circuits based on the voltage between the IN terminal and the GND terminal. Therefore, when the voltage amplitude of the pulse voltage VIN draws the constant current It in the L level period, a voltage drop occurs by the resistance inserted when the constant current It is drawn. As a result, the effective voltage between the IN terminal and the GND terminal drops. Therefore, the power supply voltage of the internal circuit in the data carrier device 20 drops, and possibly interferes with a stable operation. Assume that a method of detecting a voltage value of resistance connected to the IN terminal is used as a data signal reception unit. In this case, as a method of improving the detection precision for a certain constant current It, it is effective to increase the voltage value generated in resistance by raising the resistance value connected to the IN terminal. However, in this case, the voltage drop value by the resistance when the constant current It is drawn also increases. As a result, the effective voltage between the IN terminal and the GND terminal largely drops, thereby possibly interfering with a stable operation of an internal circuit in the data carrier device 20. Therefore, it is effective to limit the period in which the constant current It is drawn in the H level period of the voltage amplitude of the pulse voltage VIN input to the IN terminal with a moderate restriction of an operation voltage condition.

A method of detecting whether the amplitude of the voltage VIN input to the IN terminal of the data carrier device 20 from the data carrier drive device 25 is the H level or the L level can be the method shown in FIG. 6. The level shift circuit 33 for voltage-amplitude-converting the pulse voltage VIN input to the IN terminal detects the absolute value of the voltage having the rise threshold voltage Vr at the rise time and the fall threshold voltage Vf at the fall time of the voltage input to the IN terminal. In this case, as shown in the timing chart shown in FIG. 13, the following operation is performed. First, in the L level of the amplitude of the voltage VIN input to the IN terminal, the L level of the output signal Vs of the level shift circuit 33 changes to the H level of the amplitude of the voltage VIN input to the IN terminal. At this time, the state in which the rise threshold voltage Vr has been exceeded is detected, and the output signal Vs of the level shift circuit 33 becomes the H level. Next, when the amplitude of the voltage VIN input to the IN terminal changes from the H level to the L level, the state in which the fall threshold voltage Vf has been exceeded is detected, and the output signal Vs of the level shift circuit 33 becomes the L level.

When the current It flows as a data transmission unit, and the data carrier drive device 25 inserts resistance into the space to the IN terminal as a unit for receiving the data signal from the data carrier device 20, the voltage drop $\Delta V$ is caused by the resistance value and the current It. At this time, the current control circuit 34 generates a constant current control signal Vt using the output signal Vs from the level shift circuit 33 as a reference. In the H level period of the output signal Vs from the level shift circuit 33, that is, in the H level period of the amplitude of the voltage VIN input to the IN terminal, the current It as a data transmission unit of the data carrier device is passed under control. The constant current control signal Vt is input to the delay circuit 131. The delay circuit 131 operates as shown in FIG. 13. The delay circuit 131 moderates the current change from the state in which the constant current It as a data signal passed by the constant current circuit 132 is not passed to the state in which a current of a set value is passed, or from the state in which a current of a set value is passed to the state in which the current is not passed.

Therefore, when the amplitude of the voltage VIN input to the IN terminal changes from the L level to the H level, the state in which the rise threshold voltage Vr has been exceeded is detected, and the output signal Vs from the level shift circuit 33 and the constant current control signal Vt are switched. At this time, the current change from the state in which the constant current It as a data signal passed by the constant current circuit 132 is not passed to the state in which the current of a set value is passed is moderated. Therefore, a voltage drop $\Delta V$ is moderately generated by the resistance value and the current It as a data signal reception unit. Similarly, when the amplitude of the voltage VIN input to the IN terminal changes from the H level to the L level, the state in which the fall threshold voltage Vf has been exceeded is detected, and the output signal Vs from the level shift circuit and the constant current control signal Vt are switched. At this time, the current change of the constant current It as a data signal passed by the constant current circuit 132 from the state in which a current of a set value is passed to the state in which it is not passed is moderated. Therefore, the voltage drop $\Delta V$ by the resistance value and the current It as a data signal reception unit occurs moderately.

Figure 14:
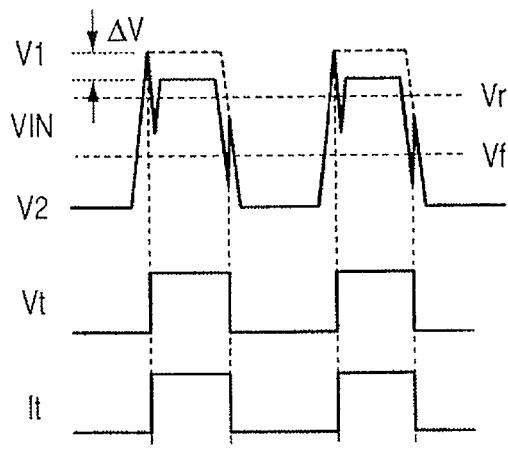
FIG. 14 is a timing chart showing the operation of the conventional current control circuit.

FIG. 14 illustrates a timing chart of the case where there is no delay circuit 131. When the amplitude of the voltage VIN input to the IN terminal changes from the L level to the H level, the state in which the rise threshold voltage Vr has been exceeded is detected, and the output signal Vs from the level shift circuit 33 and the constant current control signal Vt are switched. Immediately after the switch, a sudden change is made from the state in which the constant current It as a data signal to be passed by the constant current circuit 132 is not passed to the state in which a current of a set value is passed. Similarly, when the amplitude of the voltage VIN input to the IN terminal changes from the H level to the L level, the state in which the fall threshold voltage Vf has been exceeded is detected, and the output signal Vs from the level shift circuit 33 and the constant current control signal Vt are switched. Immediately after the switch, a sudden change is made from the state in which the constant current It as a data signal to be passed by the constant current circuit 132 is passed to the state in which the current is not passed. At this time, actually a parasitic inductance component and the like exist in the connection wiring of the data carrier drive device 25 and the data carrier device 20. Therefore, the sudden change of a current value in the connection wiring causes a ringing as shown in the timing chart of FIG. 14.

A method of detecting whether the amplitude of the voltage VIN input to the IN terminal of the data carrier device 20 from the data carrier drive device 25 is the H level or the L level can be the following method. That is, the level shift circuit 33 for voltage-amplitude-converting the pulse voltage VIN input to the IN terminal is to detect the absolute value of the voltage having the rise threshold voltage Vr at the rise time and the fall threshold voltage Vf at the fall time of the voltage VIN input to the IN terminal. With the configuration of the circuit, if the ringing component exceeds the rise threshold voltage Vr or the fall threshold voltage Vf, then the level shift circuit 33 reacts with the state, and outputs an undesired output signal Vs. The clock generation circuit 21, the data signal generation circuit 22, and the current control circuit 26 that operate based on the signal perform a malfunction, and interfere with stable data communications.

Therefore, in the present embodiment of the present invention, the delay circuit 131 moderates the current change by the ON/OFF control of a constant current as a data signal, thereby suppressing an occurrence of a ringing component, avoiding a malfunction of the level shift circuit 33, and realizing stable data communications without a malfunction.

The current control circuit shown in FIG. 12 can be applied to the current control circuit 26 shown in FIG. 11 and the current control circuit 34 shown in FIG. 6. In the case shown in FIG. 12, the internal circuit 23 generates the constant current control signal Vt based on the output signal Vs of the level shift circuit 211.

Fifth Embodiment of the Present Invention

Figure 15:
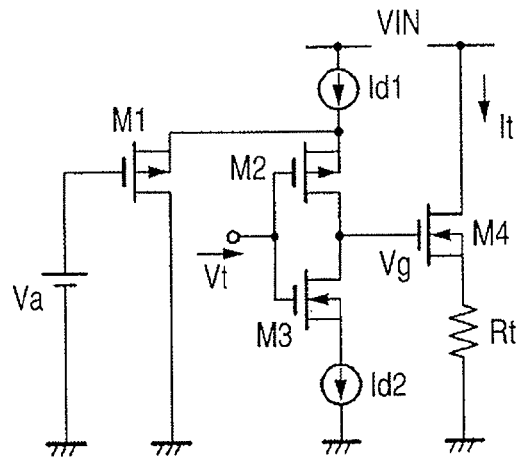
FIG. 15 illustrates an example of the configuration of the current control circuit according to a fifth embodiment of the present invention.

FIG. 15 illustrates an example of the circuit of the current control circuit 26 in the data carrier device 20 according to a fifth embodiment of the present invention. The present embodiment of the present invention practically indicates the delay circuit 131 and the constant current circuit 132 according to the fourth embodiment of the present invention. In the circuit shown in FIG. 15, the voltage source Va functions as a reference voltage circuit, and the voltage source Va is connected to the gate terminal of the PMOS (P channel MOS field effect transistor) M1. The source terminal of the transistor M1 is connected to the delay setting constant current source for passing the constant current Id1 from the power supply VIN and the source terminal of the PMOS transistor M2 in the inverter circuit configured by the PMOS transistor M2 and the NMOS transistor M3. The NMOS is an N channel MOS field effect transistor. The source terminal of the NMOS transistor M3 is connected to the delay setting constant current source for passing the constant current Id2 to the GND terminal, and the constant current control signal Vt is input to the input terminal of the inverter circuit configured by the PMOS transistor M2 and the NMOS transistor M3. The gate terminal of the NMOS transistor M4 is connected to the output terminal of the inverter circuit configured by the PMOS transistor M2 and the NMOS transistor M3, and the constant current setting resistance Rt is connected to the source terminal of the NMOS transistor M4. The other terminal of the constant current setting resistance Rt is connected to the GND terminal, and the power supply VIN is connected to the drain terminal of the NMOS transistor M4.

Figure 16:
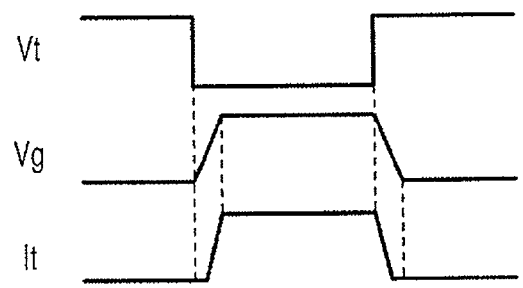
FIG. 16 is a timing chart showing the operation of the current control circuit shown in FIG. 15.

The operation of the circuit shown in FIG. 15 is described below by referring to the timing chart of FIG. 16. First, when the constant current control signal Vt indicates the H level, the PMOS transistor M2 configuring the inverter circuit is placed in the OFF state, and the NMOS transistor M3 is placed in the ON state. Therefore, the gate terminal voltage Vg of the NMOS transistor M4 is dropped to the GND potential by the delay setting constant current source for passing the constant current Id2, and the constant current It as a data signal is not passed. If the constant current control signal Vt changes from the H level to the L level, the PMOS transistor M2 configuring the inverter circuit is placed in the ON state, and the NMOS transistor M3 is placed in the OFF state. Therefore, the gate terminal voltage Vg of the NMOS transistor M4 rises from the GND potential by the delay setting constant current source for passing the constant current Id1. At this time, if the elapsed time from the switch of the constant current control signal Vt is set as Tdc, and the gate terminal capacity of the NMOS transistor M4 is set as Cg, then the gate terminal voltage Vg is calculated as follows.

$$Vg = Tdc \times Id1 / Cg$$

If the gate-source voltage for placing the NMOS transistor M4 in the ON state is set as a threshold voltage Vth4, the current It is not passed until the gate terminal voltage Vg of the NMOS transistor M4 exceeds the threshold voltage Vth4. Furthermore, when the gate terminal voltage Vg further rises, the current It is expressed by the following equation, and gradually increases.

$$It = (Vg - Vth4) / Rt$$

The current It becomes a predetermined value when the gate terminal voltage Vg is clamped by the voltage expressed by the following equation with the gate-source voltage set as the threshold voltage Vth1 for placing the PMOS transistor M1 in the ON state.

$$Vg = Va + Vth1$$

At this time, the current It becomes a constant value, and is expressed by the following equation.

$$It = (Va + Vth1 - Vth4) / Rt$$

Therefore, by gradually charging the gate terminal voltage Vg of the NMOS transistor M4 by the delay time setting constant current ID1 from the GND potential to the clamp voltage, the current can be moderately changed from the state in which the current It is not passed to the state in which it reaches a predetermined value.

Similarly, when the constant current control signal Vt changes from the L level to the H level, the PMOS transistor M2 configuring the inverter circuit is placed in the OFF state, and the NMOS transistor M3 is placed in the ON state. Therefore, the gate terminal voltage Vg of the NMOS transistor M4 decreases from the clamped voltage by the delay setting constant current source for passing the constant current Id2. At this time, if the elapsed time from the switch of the constant current control signal Vt is set as Tdd, the gate terminal voltage Vg is calculated as follows.

$$Vg = Va + Vth1 - (Tdd \times Id2 / Cg)$$

At this time, the current It is expressed by the following equation, and gradually decreases.

$$It = (Va + Vth1 - (Tdd \times Id2 / Cg) - Vth4) / Rt$$

Furthermore, the gate terminal voltage Vg drops, and when the gate terminal voltage Vg becomes lower than the threshold voltage Vth4, the current It stops. Therefore, by gradually discharging the gate terminal voltage Vg of the NMOS transistor M4 from the clamp voltage to the GND potential with the delay time setting constant current Id2, the current can be moderately changed until the current It changes from a predetermined value to the stop state.

In FIG. 15, the transistor M4 and the resistance Rt configure the constant current circuit 132 shown in FIG. 12, and other components configures the delay circuit 131 shown in FIG. 12. The delay circuit 131 has an inverter (transistors M2 and M3) for logically inverting the constant current control signal Vt, and outputs the signal Vg obtained by delaying and logically inverting the constant current control signal Vt. The constant current circuit 132 controls whether or not the constant current It is to be passed according to the constant current control signal Vg. As shown in FIG. 16, the constant current control signal Vg level-changes more moderately than the constant current control signal Vt.

According to the present embodiment of the present invention, the generation of a ringing component can be suppressed by moderating the current change by ON/OFF controlling the constant current as a data signal by the delay circuit with a simple circuit configuration, thereby avoiding the malfunction of a level shift circuit, and realizing stable data communications without a malfunction.

Sixth Embodiment of the Present Invention

Figure 17:
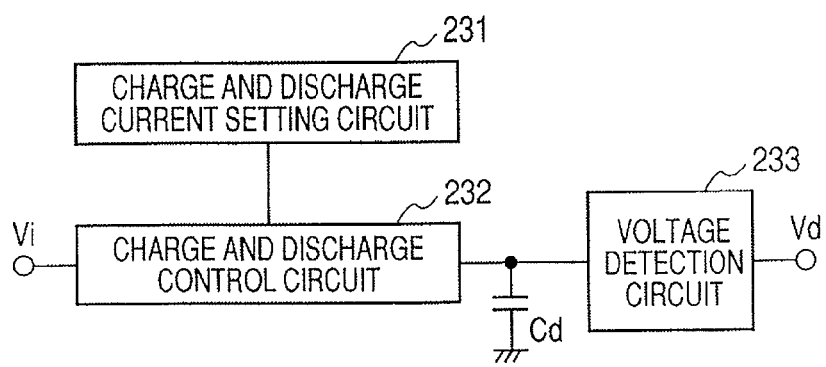
FIG. 17 illustrates an example of the configuration of the delay circuit according to a sixth embodiment of the present invention.

FIG. 17 is a block diagram showing an example of the configuration of the delay circuit 213 (FIG. 3) in the clock generation circuit 21 in the data carrier device 20 according to a sixth embodiment of the present invention. The predetermined embodiment of the present invention practically shows the delay circuit 213 in the clock generation circuit 21 according to the first embodiment of the present invention (FIG. 3). The delay circuit shown in FIG. 17 includes a charge/discharge current setting circuit 231, a charge/discharge control circuit 232, and a voltage detection circuit 233. A delay time setting capacity Cd is held between the charge/discharge control circuit 232 and the voltage detection circuit 233. The charge/discharge current setting circuit 231 sets a charge/discharge current. Raising the voltage of the capacity Cd by charging with the charge current value for which the delay time setting capacity Cd is set by the charge/discharge control circuit 232 or dropping the voltage of the capacity Cd by discharging with the set discharge current value can be controlled. By the voltage detection circuit 233 detecting the voltage level of the delay time setting capacity Cd, the input signal Vi input to the charge/discharge control circuit 232 is delayed by a certain delay time, and output as an output signal Vd.

Figure 18:
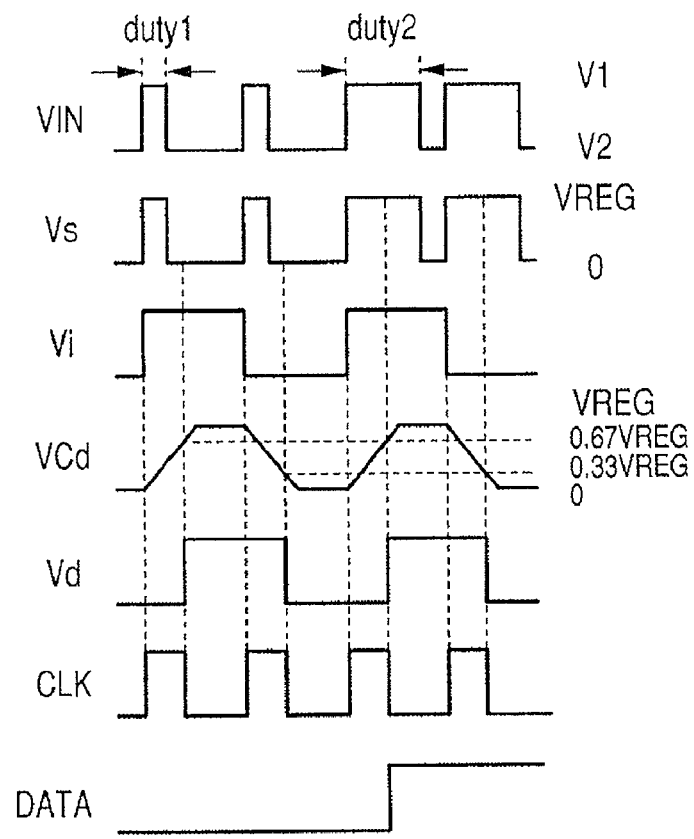
FIG. 18 is a timing chart showing the operation of the delay circuit shown in FIG. 17.

The operation of the delay circuit shown in FIG. 17 is described below by referring to the timing chart shown in FIG. 18. Between the IN terminal of the data carrier device 20 and the GND terminal, a pulse voltage VIN having two values, that is, duty 1 and duty 2 for the H level period (duty) of a pulse with a constant frequency of V1 for the H level and V2 for the L level of the voltage amplitude is input. The pulse voltage VIN input to the data carrier device 20 is voltage-amplitude-converted by the level shift circuit 211 such that the H level refers to the VREG, and the L level refers to the GND potential, and is output as a level shift voltage Vs. The level shift voltage Vs is divided into ½ frequencies by the ½ frequency division circuit 212, and an input signal Vi to the delay circuit 213 by a switch to the H level and the L level is generated in synchronization with the rise of the level shift voltage Vs.

The input signal Vi is input to the charge/discharge control circuit 232, and is controlled such that the delay time setting capacity Cd is charged in the L level period, and the delay time setting capacity Cd is discharged in the L level period. The power supply voltage of the delay circuit 213 is defined as the output voltage VREG of the regulator circuit 24 of the data carrier device 20. In this case, the voltage VCd of the delay time setting capacity Cd starts charging from the GND potential with the charge current value set by the charge/discharge current setting circuit 231 at the rise of the input signal Vi, and reaches the output voltage VREG of the regulator circuit 24. The discharge is started from the potential VREG at the discharge current value set by the charge/discharge current setting circuit 231 at the fall of the input signal Vi, and the potential reaches the GND potential.

The voltage detection circuit 233 for detecting the voltage VCd of the delay time setting capacity Cd is configured by a comparator with hysteresis for detecting a voltage level. Thus, an output signal Vd is generated such that the comparator output is switched from the L level to the H level during the charging period of the voltage VCd of the delay time setting capacity Cd, and the comparator output is switched from the H level to the L level during the discharging period of the voltage VCd. Thus, a signal Vd whose delay time from the input signal Vi is controlled can be output by the time of charge or discharge of the delay time setting capacity Cd and the threshold of the comparator with hysteresis for detecting the voltage level.

Assume that the charge current and the discharge current for the delay time setting capacity Cd set by the charge/discharge current setting circuit 231 are equally set to Ic, and the charge/discharge current Ic is set to a value correlated with the output voltage VREG of the regulator circuit 24 as a power supply voltage of the circuit. For example, the charge/discharge current Ic is calculated as follows when it is set by a coefficient α, the voltage VREG, and the charge/discharge current resistance value Rc.

$$Ic = \alpha \times VREG / Rc$$

Furthermore, the threshold voltage of the comparator with hysteresis for detection of the voltage level of the voltage detection circuit 233 is set as a value correlated with the output voltage VREG of the regulator circuit, and is set as follows.

$$\text{Rise detection threshold} = \frac{2}{3} \times VREG$$

$$\text{Fall detection threshold} = \frac{1}{3} \times VREG$$

Then, the delay time at the rise and fall of the voltage VCd of the delay time setting capacity Cd is calculated as follows.

$$\begin{aligned}\text{delay time at rise time} &= Cd \times (2/3 \times VREG - 0)/(\alpha \times VREG/Rc)\\ &= 2/3/\alpha \times Cd \times Rc \quad \text{delay time at fall time}\\ &= Cd \times (VREG - 1/3 \times VREG)/(\alpha \times VREG/Rc)\\ &= 2/3/\alpha \times Cd \times Rc\end{aligned}$$

Therefore, the delay time at the rise time is equal to the delay time at the fall time, and the charge/discharge current and the threshold of the voltage detection circuit are set to the values correlated with the output voltage VREG of a regulator circuit as a power supply voltage of the circuit. Thus, the delay time is set only by the delay time setting capacity Cd and the charge/discharge current resistance value Rc. The input signal Vi to the delay circuit and the output signal Vd from the delay circuit can be calculated as a clock signal CLK of the data carrier device 20 by the EX-OR (exclusive logical sum) arithmetic. Therefore, the delay time at the rise time and the delay time at the fall time correspond to the clock width, and the clock width is a constant value set only by the delay time setting capacity Cd and the charge/discharge current resistance value Rc.

The data carrier device 20 has only two terminals, and holds the output voltage VREG of the regulator circuit 24 by the holding capacity Co in the data carrier device 20. At this time, the large consumption of the current passing transiently when the internal circuit is operating is supplied by the holding capacity Co instantaneously. Therefore, the higher the holding capacity Co, the lower the drop of the momentary regulator output voltage VREG. As a result, the stable operation of the internal circuit can be performed. However, since the holding capacity Co is configured in the data carrier device 20, the data carrier device 20 itself becomes large and costly.

However, according to the present embodiment of the present invention, the clock width is set only by the delay time setting capacity Cd and the charge/discharge current resistance value Rc. Therefore, the value of the holding capacity Co for holding the output voltage VREG of the regulator circuit 24 is small, and has little influence although the output voltage VREG transiently drops largely, thereby possibly outputting the clock signal CLK having a constant clock width. The clock generation circuit 21 and the data signal generation circuit 22 are mostly configured by logical circuits, and the output voltage VREG of the regulator circuit 24 as a power supply voltage of the circuit for operating a logical circuit is sufficiently low. Therefore, the clock generation circuit 21 and the data signal generation circuit 22 are hardly affected by the transient drop of the output voltage VREG of the regulator circuit 24.

According to the present embodiment of the present invention, although the value of the holding capacity Co is small, a less expensive data carrier device 20 capable of enabling the clock generation circuit 21 and the data signal generation circuit 22 to be stably operated without a malfunction can be realized.

In addition, as a circuit configuration of suppressing the influence of a momentary drop of the output voltage VREG, a charge/discharge current value is set by certain reference voltage and charge/discharge current resistance value. Then, the threshold voltage of the comparator with hysteresis for detecting the voltage level of the voltage detection circuit 233 is set from the reference voltage. In this method, a circuit configuration capable of setting a clock width only by the delay time setting capacity and the charge/discharge current resistance value can be realized. However, in this case, to suppress the influence of the momentary drop of the output voltage VREG, it is necessary to set the threshold voltage of the comparator with hysteresis for detecting the voltage level of the voltage detection circuit close to the voltage of the GND potential. At this time, it is necessary to set the range of the operation voltage of the delay time setting capacity Cd and the range of the voltage detected by the voltage detection circuit to the value of the voltage close to the GND potential. At this time, for example, the offset voltage characteristic of the comparator with hysteresis becomes so large that it cannot be ignored with respect to the delay time setting capacity Cd and the range of the voltage of the voltage detection circuit. Therefore, the precision of the delay time is deteriorated. To improve the precision of the clock width to be generated, the present embodiment of the present invention that sets a large delay time setting capacity Cd and a large voltage range of the voltage detection circuit 233 is effective.

Seventh Embodiment of the Present Invention

Figure 19:
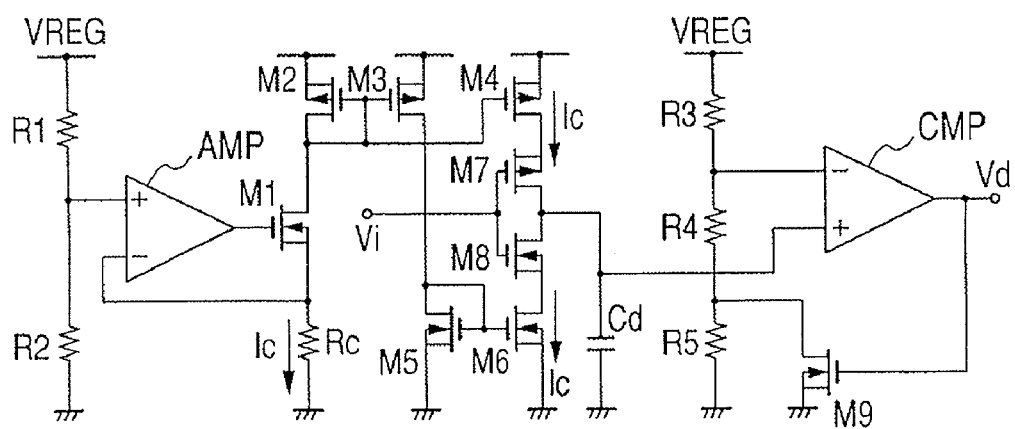
FIG. 19 illustrates an example of the configuration of the delay circuit according to a seventh embodiment of the present invention.

FIG. 19 illustrates an example of the delay circuit 213 (FIG. 3) in the clock generation circuit 21 in the data carrier device 20 according to a seventh embodiment of the present invention. The present embodiment of the present invention practically indicates the delay circuit 213 in the clock generation circuit 21 according to the sixth embodiment of the present invention.

In the delay circuit shown in FIG. 19, the power supply voltage VREG with the resistance divided between the resistance R1 and R2 in the charge/discharge current setting circuit 231 inputs to the + side input terminal of the amplifier circuit AMP. The output terminal of the amplifier circuit AMP is input to the gate terminal of the NMOS transistor (N channel MOS field effect transistor) M1. The source terminal of the transistor Ml is connected to the − side input terminal of the amplifier circuit AMP and the charge/discharge current setting resistance Rc. In the PMOS transistor M2, the drain terminal and the gate terminal are connected to the drain terminal of the transistor M1, and the source terminal is connected to the power supply VREG, thereby passing the current Ic.

As the charge/discharge control circuit 232, the transistor M2 has a PMOS current mirror circuit configured by the transistors M3 and M4. The current Ic also passes through the transistor M4 as well as the transistor M2. The drain terminal of the transistor M3 is connected to the drain terminal and the gate terminal of the transistor M5. In the transistors M5 and M6, the source terminal is connected to the GND potential and configures an NMON current mirror circuit. The drain terminal of the PMOS current mirror M4 is connected to the source terminal of the transistor M7 configuring an inverter circuit, and the drain terminal of the NMOS current mirror M6 is connected to the source terminal of the transistor M8 configuring an inverter circuit. The input signal Vi to the charge/discharge control circuit 232 is input to the input terminal of the inverter circuit configured by the transistors M7 and M8. The output terminal of the inverter circuit configured by the transistors M7 and M8 is connected to the delay time setting capacity Cd, and the other terminal of the delay time setting capacity Cd is connected to the GND potential. The charge/discharge control circuit 232 controls the charge and discharge using the current Ic for the capacity Cd according to the input signal Vin.

In the voltage detection circuit 233, the output terminal of the inverter circuit configured by the transistors M7 and M8 and the delay time setting capacity Cd are connected to the + side input terminal of the comparator circuit CMP. The power supply voltage VREG is divided by the resistance R3, R4, and R5 and input to the − side input terminal of the comparator circuit CMP. The output terminal of the comparator circuit CMP is output as the output voltage Vd of the voltage detection circuit 233, and connected to the gate terminal of the transistor M9 as a hysteresis voltage control NMOS. The drain terminal of the transistor M9 is connected to the resistance R4 and R5, and the source terminal of the transistor M9 is connected to the GND potential. The comparator circuit CMP compares the voltage of the capacity Cd with the threshold voltage, and outputs a signal Vd obtained by delaying the input signal Vi.

Figure 20:
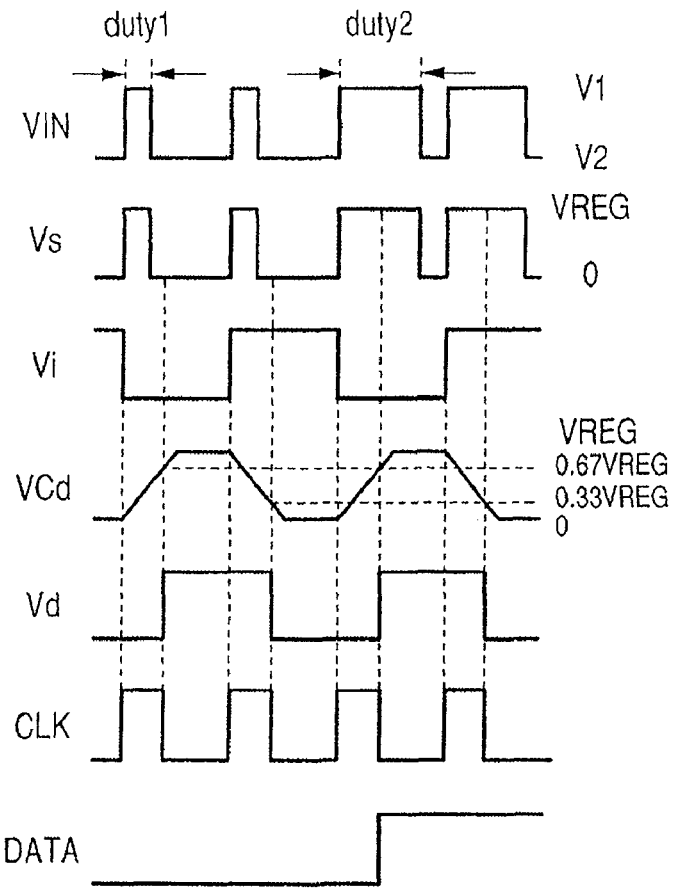
FIG. 20 is a timing chart showing the operation of the delay circuit shown in FIG. 19.
Figure 21:
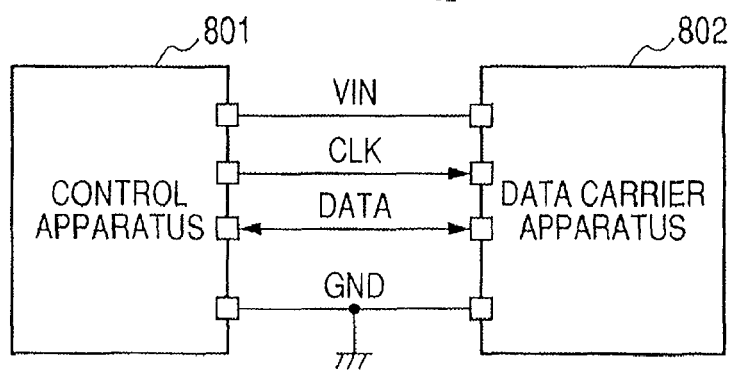
FIG. 21 illustrates an example of the configuration of the conventional data communication system.

The operation of the delay circuit shown in FIG. 19 is described below by referring to the timing chart shown in FIG. 20. Between the IN terminal of the data carrier device 20 and the GND terminal, a pulse voltage VIN having two values, that is, duty 1 and duty 2 for the H level period (duty) of a pulse with a constant frequency of V1 for the H level and V2 for the L level of the voltage amplitude is input. The pulse voltage VIN input to the data carrier device 20 is voltage-amplitude-converted by the level shift circuit 211 such that the H level refers to the VREG, and the L level refers to the GND potential, and is output as a level shift voltage Vs. The level shift voltage Vs is divided into ½ frequencies by the ½ frequency division circuit 212, and an input signal Vi to the delay circuit 213 by a switch to the H level and the L level is generated in synchronization with the rise of the level shift voltage Vs. The input signal Vi is input to the inverter circuit configured by the transistors M7 and M8 as the charge/discharge control circuit 232.

In the charge/discharge current setting circuit 231, the power supply voltage VREG divided by the resistance R1 and R2 is supplied to both ends of the charge/discharge current setting circuit. Therefore, the charge/discharge current Ic proportional to the power supply voltage VREG is set, and the charge/discharge current Ic is calculated as follows.

Charge/discharge current $Ic = R2/(R1+R2) \times VREG/Rc$

The charge/discharge current Ic is switched between the charge and the discharge to the delay time setting capacity Cd according to the input signal Vi to the charge/discharge control circuit 232. The capacity Cd is used in charge and discharge according to the input signal Vi. When the input signal Vi is at the L level, the PMOS transistor M7 of the inverter circuit is placed in the ON state, and the NMOS transistor M8 is placed in the OFF state. Therefore, the charge current Ic passes to the delay time setting capacity Cd, and the voltage VCd of the delay time setting capacity Cd rises. When the input signal Vi is at the H level, the PMOS transistor M7 of the inverter circuit is placed in the OFF state, and the NMOS transistor M8 is placed in the ON state. Therefore, the discharge current Ic passes from the delay time setting capacity Cd, and the voltage VCd of the delay time setting capacity Cd drops. Thus, the charge is started from the GND potential for the voltage VCd of the delay time setting capacity Cd at the fall of the input signal Vi with the charge current Ic set by the charge/discharge current setting circuit 231, thereby reaching the output voltage VREG of the regulator circuit 24. Then, the discharge is started from the potential VREG with the discharge current Ic set by the charge/discharge current setting circuit 231 at the rise of the input signal Vi, thereby reaching the GND potential.

The power supply voltage VREG is divided by the resistance R3, R4 and R5 to set a threshold correlated with the power supply voltage VREG. The comparator circuit CMP with hysteresis as the voltage detection circuit 233 for detecting the voltage level of the voltage VCd of the delay time setting capacity Cd sets the following resistance value.

$R3 = 2 \times R4$ $R5 = 3 \times R4$

Then, in the state in which the input signal Vi is placed at the H level for a long time, and the voltage VCd of the delay time setting capacity Cd has dropped substantially to the GND potential, the + side input terminal of the comparator circuit CMP is placed substantially at the GND potential. Therefore, the output terminal voltage Vd of the comparator circuit CMP is at the L level, and the hysteresis voltage control NMOS transistor M9 is turned off. If the input signal Vi enters the L level, the PMOS transistor M7 of the inverter circuit is turned on and the NMOS transistor M8 is turned off. As a result, the charge current Ic is passed to the delay time setting capacity Cd, and the voltage VCd of the delay time setting capacity Cd rises. Since the hysteresis voltage control NMOS transistor M9 is turned off, the threshold of the comparator with hysteresis is calculated as follows.

$$\text{Rise detection threshold} = (R4 + R5)/(R3 + R4 + R5) \times VREG$$
$$= (R4 + 3 \times R4)/(2 \times R4 + R4 + 3 \times R4) \times VREG$$
$$= 2/3 \times VREG$$

When the voltage VCd of the delay time setting capacity Cd exceeds the rise detection threshold, the output terminal voltage Vd of the comparator circuit CMP enters the H level, and the hysteresis voltage control NMOS transistor M9 is turned on. Next, when the input signal Vi enters the H level, the PMOS transistor M7 of the inverter circuit is turned off, and the NMOS transistor M8 is turned on. Therefore, the discharge current Ic passes from the delay time setting capacity Cd, and the voltage VCd of the delay time setting capacity Cd drops. Since the hysteresis voltage control NMOS transistor M9 is turned on, the threshold of the comparator with hysteresis is calculated as follows.

$$\text{Rise detection threshold} = R4/(R3 + R4) \times VREG$$
$$= R4/(2 \times R4 + R4) \times VREG$$
$$= 1/3 \times VREG$$

When the voltage VCd of the delay time setting capacity Cd exceeds the fall detection threshold, the output terminal voltage Vd of the comparator circuit CMP enters the L level, and the hysteresis voltage control NMOS transistor M9 is turned off.

At this time, the delay time at the rise and fall time of the voltage VCd of the delay time setting capacity Cd is calculated as follows.

$$\text{Delay time at the rise time} = Cd \times (2/3 \times VREG - 0)/$$
$$(R2/(R1 + R2) \times VREG/Rc)$$
$$= 2/3 \times (R1 + R2)/R2 \times Cd \times Rc$$

$$\text{Delay time at the fall time} = Cd \times (VREG - 1/3 \times VREG)/$$
$$(R2/(R1 + R2) \times VREG/Rc)$$
$$= 2/3 \times (R1 + R2)/R2 \times Cd \times Rc$$

Therefore, the delay time at the rise time is equal to the delay time at the fall time, and the charge/discharge current and the threshold of the voltage detection circuit are set to the values correlated with the output voltage VREG of a regulator circuit 24 as a power supply voltage of the circuit. Thus, the delay time is set only by the resistance ratio between the resistance R1 and R2, the delay time setting capacity Cd, and the charge/discharge current resistance value Rc. When the data carrier device 20 is generated in a general semiconductor process, the resistance ratio between the resistance R1 and R2 is maintained substantially constant. Therefore, the delay time at the rise time and the delay time at the fall time are set only by the delay time setting capacity Cd and the charge/discharge current resistance value Rc. The input signal Vi to the delay circuit and the output signal Vd from the delay circuit can be calculated as a clock signal CLK of the data carrier device 20 by the EX-OR arithmetic of the EX-OR (exclusive logical sum) circuit 241. Therefore, the delay time at the rise time and the delay time at the fall time correspond to the clock width, and the clock width is a constant value set only by the delay time setting capacity Cd and the charge/discharge current resistance value Rc.

According to the present embodiment of the present invention, the clock width is set only by the delay time setting capacity Cd and the charge/discharge current resistance value Rc. Therefore, the value of the holding capacity Co for holding the output voltage VREG of the regulator circuit 24 is small, and has little influence although the output voltage VREG transiently drops largely, thereby possibly outputting the clock signal CLK having a constant clock width. Since the circuits of the current mirror circuit and the inverter circuit have wide ranges of power supply voltages, they can be sufficiently operated although the output voltage VREG of the regulator circuit 24 as a power supply voltage transiently drops. The clock generation circuit 21 and the data signal generation circuit 22 are mostly configured by logical circuits, and the output voltage VREG of the regulator circuit 24 as a power supply voltage of the circuit for operating a logical circuit is sufficiently low. Therefore, the clock generation circuit 21 and the data signal generation circuit 22 are hardly affected by the transient drop of the output voltage VREG of the regulator circuit 24.

According to the present embodiment of the present invention, although the value of the holding capacity Co is small, a less expensive data carrier device 20 capable of enabling the clock generation circuit 21 and the data signal generation circuit 22 to be stably operated with a simple circuit configuration without a malfunction can be realized.

In addition, as a circuit configuration of suppressing the influence of a momentary drop of the output voltage VREG, a charge/discharge current value is set by certain reference voltage and charge/discharge current resistance value. Then, the threshold voltage of the comparator with hysteresis for detecting the voltage level of the voltage detection circuit 233 is set from the reference voltage. In this method, a circuit configuration capable of setting a clock width only by the delay time setting capacity and the charge/discharge current resistance value can be realized. However, in this case, to suppress the influence of the momentary drop of the output voltage VREG, it is necessary to set the threshold voltage of the comparator with hysteresis for detecting the voltage level of the voltage detection circuit 233 close to the voltage of the GND potential. At this time, it is necessary to set the range of the operation voltage of the delay time setting capacity Cd and the range of the voltage detected by the voltage detection circuit to the value of the voltage close to the GND potential. At this time, for example, the offset voltage characteristic of the comparator with hysteresis becomes so large that it cannot be ignored with respect to the delay time setting capacity Cd and the range of the voltage of the voltage detection circuit. Therefore, the precision of the delay time is deteriorated. To improve the precision of the clock width to be generated, the present embodiment of the present invention that sets a large delay time setting capacity Cd and a large voltage range of the voltage detection circuit is effective.

According to the first to seventh modes for embodying the present invention, the type of H level period (duty) of the pulse voltage input to the IN terminal of the data carrier device 20 from the data carrier drive device 25 can be multivalued, for example, three or more values. If it is binary, it is not necessary to obtain a result of a 100% correlation as a total of two H level periods (duty) as long as the two H level periods (duty) can be easily identified.

In the first to seventh modes for embodying the present invention, the configuration includes an IN terminal as a signal terminal and a GND terminal as a reference voltage terminal. However, it is not necessary that the reference voltage terminal is GND potential. For example, a constant voltage is input as a reference voltage to a terminal of the data carrier device, and a signal is input from the data carrier drive device to the other terminal of the data carrier device. Furthermore, for example, it is also possible that the reference voltage of the data carrier device is not input from the data carrier drive device, but a reference voltage is input from a device other than the data carrier drive device to one terminal of the data carrier device. In addition, for example, it is also possible that the reference voltage terminal of the data carrier device is not a constant voltage, and the signals input to the two terminals of the data carrier device from the data carrier drive device have frequencies and duty signals. If data communications can be performed between the data carrier drive device and the data carrier device based on the signal generated between the two terminals of the data carrier device, then a signal of any configuration can be accepted in the data carrier drive device and the data carrier device.

In the descriptions of the modes for embodying the present invention, any circuit configuration having the identical functions is acceptable.

As described above, according to the first to seventh modes for embodying the present invention, a two-wire contact data communication system having the data carrier device and its drive device for performing data communication through the first and second contact points can be provided. The data carrier drive device and the data carrier device are connected to each other only through the two terminals, that is, the IN terminal as the first connection point and the GND terminal as the reference voltage terminal that is the second connection point. A voltage is applied to the data carrier device from the data carrier drive device through the IN terminal, and the GND terminal as the reference voltage terminal that is the second connection point is grounded. The data carrier device generates a power supply for all circuits by the voltage applied from the IN terminal. The clock generation circuit generates a clock signal correlated with the voltage applied from the IN terminal. The data signal generation circuit generates a data signal correlated with the voltage applied from the IN terminal. The internal circuit uses a signal output from the clock generation circuit as a clock signal, uses a signal output from the data signal generation circuit as a data signal, and performs data communications based on these signals.

According to the first to fifth modes for embodying the present invention, the regulator circuit provides a power supply voltage of an internal circuit in the data carrier device. The level shift circuit performs a voltage amplitude conversion on a voltage signal applied from the IN terminal of the data carrier device. The regulator circuit and the level shift circuit have the same reference voltage circuit, and the output voltage of the regulator circuit is correlated with the threshold voltage of the level shift circuit.

According to the sixth and seventh modes for embodying the present invention, the clock generation circuit sets the charge/discharge current value and the threshold of the voltage detection circuit as values correlated with the power supply voltage of the circuit, and generates a clock signal set only by the delay time setting capacity and the charge/discharge current resistance value.

A system can be downsized by performing bi-directional data communications on two connection points, and a less expensive system can be realized. Additionally, a data carrier device capable of performing stable data communications without a malfunction with a simple circuit configuration requiring no strict precision can be realized. Furthermore, according to the sixth and seventh modes for embodying the present invention, a less expensive data carrier device capable of stably operating without a malfunction can be realized by the clock generation circuit 21 and the data signal generation circuit 22.

In the above-mentioned modes for embodying the present invention, practical examples are described in embodying the present invention, and the present invention is not limited to these restrictive interpretations in the technical scope. That is, the present invention can be embodied in various forms within the scope of its technical concepts and primary characteristics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-114884, filed Apr. 18, 2006, which is hereby incorporated by reference herein in its entirety.

What is claimed is:

1. A data communication device, comprising:
a signal terminal for inputting a received signal having portions of different duty ratios and a constant pulse frequency;
a reference voltage terminal for inputting a first reference voltage;
a clock generation circuit for generating a clock signal according to the received signal;
a data signal generation circuit for generating a data signal by identifying a duty ratio of the received signal;
a transmission circuit for outputting a transmission signal to the signal terminal;
a regulator circuit for generating power supply voltages of the clock generation circuit, the data signal generation circuit, and the transmission circuit on a basis of an internally generated second reference voltage, the received signal, and the first reference voltage; and
a reference voltage circuit for generating the second reference voltage; and a level shift circuit for level-shifting a pulse of the received signal on a basis of a threshold correlated with the second reference voltage,
wherein the regulator circuit generates a power supply voltage correlated with the second reference voltage, and there is a correlation between the threshold and the power supply voltage.

2. The data communication device according to claim 1, wherein the transmission circuit outputs the transmission signal only in a high level period of the received signal.

3. The data communication device according to claim 1, further comprising a capacitor for holding a power supply voltage generated by the regulator circuit.

4. The data communication device according to claim 1, wherein the level shift circuit level-shifts the received signal to a pulse of the power supply voltage and the first reference voltage.

5. The data communication device according to claim 1, wherein:
the transmission circuit comprises a current control circuit, connected to the signal terminal, for controlling whether or not a constant current is to be passed according to a constant current control signal for outputting of the transmission signal to the signal terminal; and
the current control circuit comprises: a delay circuit for delaying the constant current control signal; and a control circuit for controlling whether or not a constant current is to be passed on a basis of the delayed constant current control signal.

6. The data communication device according to claim 1, wherein the clock generation circuit comprises:
a level shift circuit for level-shifting the received signal;
a frequency division circuit for frequency-dividing the level-shifted signal;
a delay circuit for delaying the frequency-divided signal; and
a logical arithmetic circuit for performing a logical operation on a basis of an output signal of the frequency division circuit and an output signal of the delay circuit, and for outputting a clock signal.

7. The data communication device according to claim 6, wherein the delay circuit comprises:
a capacitor for performing charging and discharging according to an input signal; and
a comparator circuit for comparing a voltage of the capacitor with a threshold voltage, and outputting a signal obtained by delaying the input signal.

8. The data communication device according to claim 7, wherein
the delay circuit comprises:
a current setting circuit for passing a current; and
a charge/discharge control circuit for configuring the current setting circuit and a current mirror, and performing charging and discharging on the capacitor according to the input signal.

9. The data communication device according to claim 8, wherein:
a threshold voltage of the comparator circuit is a voltage correlated with the power supply voltage; and
the current setting circuit passes a current correlated with the power supply voltage.

10. The data communication device according to claim 1, wherein the reference voltage circuit is a band gap reference voltage generation circuit for generating a band gap reference voltage as the second reference voltage.

11. The data communication device according to claim 6, wherein:
the delay circuit comprises:
a charge/discharge current setting circuit for setting a charge/discharge current;
a charge/discharge control circuit for receiving an output signal from the frequency division circuit and controlling charge and discharge;
a delay time setting capacitor for setting a delay time according to an output signal from the charge/discharge control circuit; and
a voltage detection circuit for detecting a voltage value of the delay time setting capacity,
the charge/discharge current setting circuit sets a current correlated with an output voltage of the regulator circuit, and
the voltage detection circuit detects a voltage value of the delay time setting capacity using a threshold correlated with an output voltage of the regulator circuit.

12. A data communication device, comprising:
a signal terminal for inputting a received signal;

a reference voltage terminal for inputting a first reference voltage;

a clock generation circuit for generating a clock signal according to the received signal;

a data signal generation circuit for generating a data signal according to the received signal;

a transmission circuit for receiving the clock signal and the data signal and outputting a transmission signal to the signal terminal;

a regulator circuit for generating power supply voltages of the clock generation circuit, the data signal generation circuit, and the transmission circuit on a basis of an internally generated second reference voltage, the received signal, and the first reference voltage;

a reference voltage circuit for generating the second reference voltage; and a level shift circuit for level-shifting a pulse of the received signal on a basis of a threshold correlated with the second reference voltage, wherein the regulator circuit generates a power supply voltage correlated with the second reference voltage, and there is a correlation between the threshold and the power supply voltage.

13. A data communication system in which a first data communication device and a second data communication device are connected through at least a signal terminal, wherein the first data communication device comprises:

a voltage amplitude modulation circuit for outputting a signal having portions of different duty ratios and a constant pulse frequency to the second data communication device through the signal terminal on a basis of data; and a current detection circuit for generating a data signal on a basis of a current running through the signal terminal, and the second data communication device comprises:

a signal terminal for inputting from the first data communication device the signal having portions of different duty ratios and a constant pulse frequency as a received signal;

a reference voltage terminal for inputting a first reference voltage;

a clock generation circuit for generating a clock signal according to the received signal;

a data signal generation circuit for generating a data signal by identifying a duty ratio of the received signal;

a transmission circuit for outputting a transmission signal to the signal terminal;

a regulator circuit for generating power supply voltages of the clock generation circuit, the data signal generation circuit, and the transmission circuit on a basis of an internally generated second reference voltage, the received signal, and the first reference voltage, a reference voltage circuit for generating the second reference voltage; and a level shift circuit for level-shifting a pulse of the received signal on a basis of a threshold correlated with the second reference voltage, wherein the regulator circuit generates a power supply voltage correlated with the second reference voltage, and there is a correlation between the threshold and the power supply voltage.

14. A data communication method, comprising steps of:

inputting to a signal terminal a received signal having portions of different duty ratios and a constant pulse frequency;

inputting a first reference voltage to a reference voltage terminal;

generating a clock signal according to the received signal;

generating a data signal by identifying a duty ratio of the received signal;

outputting a transmission signal to the signal terminal;

generating power supply voltages on a basis of an internally generated second reference voltage, the received signal, and the first reference voltage;

generating the second reference voltage; and level-shifting a pulse of the received signal on a basis of a threshold correlated with the second reference voltage, wherein the step of generating power supply voltages generates a power supply voltage correlated with the second reference voltage, and there is a correlation between the threshold and the power supply voltage.

* * * * *